(12) United States Patent
Bendat et al.

(10) Patent No.: US 6,818,543 B2
(45) Date of Patent: Nov. 16, 2004

(54) PROCESS AND APPARATUS FOR MOUNTING SEMICONDUCTOR COMPONENTS TO SUBSTRATES AND PARTS THEREFOR

(75) Inventors: Zvi Bendat, New York, NY (US); Henry Chou, West Milford, NJ (US); Lionel Powell, Amityville, NY (US)

(73) Assignee: Lilogix, Inc., Londonderry, NH (US)

( * ) Notice: Subject to any disclaimer, the term of this patent is extended or adjusted under 35 U.S.C. 154(b) by 0 days.

(21) Appl. No.: 10/207,736

(22) Filed: Jul. 29, 2002

(65) Prior Publication Data

US 2003/0075939 A1 Apr. 24, 2003

Related U.S. Application Data

(60) Provisional application No. 60/309,313, filed on Aug. 1, 2001.

(51) Int. Cl.$^7$ ............................................. H01L 21/44
(52) U.S. Cl. .................................. 438/613; 228/180.22
(58) Field of Search .................................. 438/108, 613; 29/739, 740, 741, 831, 832, 842, 843, 846, 854, 857, 860; 228/180.21, 180.22

(56) References Cited

U.S. PATENT DOCUMENTS

| | | | |
|---|---|---|---|
| 4,804,810 A | | 2/1989 | Drummond et al. |
| 4,944,447 A | | 7/1990 | Thome |
| 4,986,460 A | | 1/1991 | Yamazaki et al. |
| 5,087,590 A | | 2/1992 | Fujimoto et al. |
| 5,188,280 A | * | 2/1993 | Nakao et al. ............. 228/123.1 |
| 5,297,333 A | | 3/1994 | Kusaka |
| 5,427,301 A | | 6/1995 | Pham et al. |
| 5,628,110 A | | 5/1997 | Sakaguchi et al. |
| 5,648,136 A | | 7/1997 | Bird |
| 5,988,481 A | | 11/1999 | Torihata et al. |
| 6,013,899 A | | 1/2000 | Eguchi et al. |
| 6,029,427 A | | 2/2000 | Freund et al. |
| 6,053,234 A | | 4/2000 | Kim et al. |
| 6,070,780 A | | 6/2000 | Shimura et al. |
| 6,092,713 A | | 7/2000 | Kim |
| 6,100,496 A | | 8/2000 | Takuya et al. |
| 6,131,795 A | | 10/2000 | Sato |
| 6,146,920 A | | 11/2000 | Inoue et al. |
| 6,158,648 A | | 12/2000 | Mori et al. |
| 6,168,669 B1 | | 1/2001 | Yasuda et al. |
| 6,182,733 B1 | | 2/2001 | McReynolds |
| 6,193,459 B1 | | 2/2001 | Rush |
| 6,226,452 B1 | | 5/2001 | Hundt et al. |
| 6,543,131 B1 | * | 4/2003 | Beroz et al. ................... 29/854 |

FOREIGN PATENT DOCUMENTS

| | | |
|---|---|---|
| EP | 0352454 | 1/1990 |
| EP | 0365807 | 5/1990 |
| JP | 59025232 | 2/1984 |
| JP | 59182532 | 10/1984 |
| JP | 60149142 | 8/1985 |
| JP | 61125025 | 6/1986 |
| JP | 06283573 | 10/1994 |

OTHER PUBLICATIONS

Kajiwara et al., US Patent Application Publication 2003/0001286, Jan. 2, 2003.*

* cited by examiner

*Primary Examiner*—David Zarneke
(74) *Attorney, Agent, or Firm*—McCarter & English, LLP

(57) ABSTRACT

The present invention provides a process and apparatus for mounting semiconductor components to substrates. More particularly, the apparatus includes a placing mechanism positioned on a support frame for placing the semiconductor components to the substrates. A reflow oven/furnace is integrated into the apparatus, thereby eliminating the need to transport the semiconductor components and substrates to an external furnace. Another feature of the present invention involves providing an improved vacuum substrate chuck array adapted for efficient application of suction to substrates carried thereby. Yet another feature of the invention involves a fluxless reflow process for inhibiting oxidation of eutectic solders provided on substrates.

21 Claims, 27 Drawing Sheets

US 6,818,543 B2

PROCESS AND APPARATUS FOR MOUNTING SEMICONDUCTOR COMPONENTS TO SUBSTRATES AND PARTS THEREFOR

CROSS-REFERENCE TO RELATED APPLICATIONS

This is a nonprovisional application relating to Provisional Patent Application Ser. No. 60/309,313 filed Aug. 1, 2001.

FIELD OF THE INVENTION

The present invention relates to a process and apparatus useful in mounting and/or bonding semiconductor components to substrates and parts therefor.

BACKGROUND OF THE INVENTION

A reflow (i.e., soldering) process is used to bond dies to substrates. A typical reflow process is performed after each die is placed onto a substrate. More particularly, after each die is placed onto the substrate by a bonding head, the bonding head heats the die so as to solder the die to the substrate. This heating step is repeated for each die, thereby making the overall die-substrate assembling process time-consuming and inefficient. Alternatively, a single heating process can be performed subsequent to the placement of a plurality of dies onto a set of substrates. More particularly, after a die mounting machine places the dies onto the substrates, the die and substrate assemblies are transported from the mounting machine to an external reflow oven/furnace by a separate moving mechanism, such as a conveyor system. While being transported to the external reflow oven/furnace, the dies and substrates may move relative to one another and may hence cause die/substrate misalignment.

In soldering dies to substrates, flux has been used, for instance, to temporarily secure the dies to the substrates. Various problems have been identified in connection with soldering processes using flux. For instance, optoelectronic devices are sensitive to flux residues due to absorption and bending of optical signals. As a result, a fluxless soldering process has been used in manufacturing die/substrate assemblies. Fluxless soldering has also gained increasing importance in recent years due to concerns for the environmental effect of common agents for cleaning flux residues, such as chlorofluorocarbons. Because fluxless soldering processes are typically performed at a relatively high temperature, solders are prone to oxidation, which is detrimental to die/substrate assemblies. Various attempts at fluxless soldering have been made with limited success.

Vacuum substrate chuck arrays have also been developed for holding substrates in place during die/substrate assembly. With reference to FIGS. 9A and 9B, substrates 820 are held in openings 852 formed in a vacuum substrate chuck array 850 by way of suction applied thereto through vacuum openings 858. Typically, the openings 852 are formed with round lower corners 854, preventing the substrates 820 from lying flat against the bottom 856 of the openings 852. As a result, the application of suction to the substrates 820 through the vacuum openings 858 is rendered inefficient and/or ineffective.

As discussed above, conventional die/substrate assembly processes and apparatus suffer from various problems and shortcomings. Accordingly, there is a need for an improved process and apparatus addressing such problems and shortcomings.

SUMMARY OF THE INVENTION

The present invention overcomes the disadvantages and shortcomings of the prior art discussed above by providing a new and improved die bonding apparatus and method and parts therefor. In accordance with one feature of the present invention, the apparatus includes a support frame and a placing mechanism mounted on the frame for placing a semiconductor component on a substrate. A reflow oven or furnace is mounted directly on the frame adjacent to the placing mechanism for heating a plurality of substrates and semiconductor components placed thereon in a substantially single operation directly on the frame, thereby eliminating the need to transport the semiconductor components and substrates to an external furnace.

A method for mounting semiconductor components to substrates is also provided. In accordance with this method, each of the semiconductor components is placed on a corresponding one of the substrate at a placing station, which is positioned on a support frame. The substrates and semiconductor components are then heated at a heating station. The heating station has an oven mounted directly on the frame adjacent to the placing station for performing the heating step directly on the frame. The substrates can be positioned on a supporting surface movably mounted on the frame prior to the performance of the placing step. The substrates can be positioned on the surface until the completion of the heating step.

In accordance with another feature of the present invention, a device for carrying a plurality of substrates includes at least one plate having a plurality of openings, each of which is sized and shaped so as to receive a substrate. Each of the openings is defined by a side wall and a bottom wall. Each of the bottom walls has a mechanism for applying suction to a substrate received in a corresponding one of the openings. Each of the side walls cooperates with a corresponding one of the bottom walls so as to form a substantially sharp corner such that a substrate can lie substantially flat against a corresponding one of the bottom walls. The plate can be provided with first and second plates attached to each other. In such circumstances, the openings can be formed in the first plate, extending completely through the first plate. The side walls are defined by the first plate, while the bottom walls are defined by the second plate. Each of the side walls and bottom walls are substantially straight.

Another feature of the present invention involves a mounting method including the steps of positioning a substrate and a semiconductor component placed on the substrate in a substantially air-tight compartment and withdrawing air contained in the compartment. The substrate and the semiconductor component have an eutectic solder positioned therebetween. The compartment is heated by supplying a heated gas into the compartment for a predetermined period of time so as to reflow the eutectic solder positioned between the substrate and the semiconductor component. The heated gas is substantially free of oxygen so as to inhibit oxidation of the solder. In this manner, a fluxless soldering can be performed.

BRIEF DESCRIPTION OF THE DRAWINGS

For a more complete understanding of the present invention, reference is made to the following detailed description of the invention considered in conjunction with the accompanying drawings, in which.

DETAILED DESCRIPTION OF THE INVENTION

Figure 1:
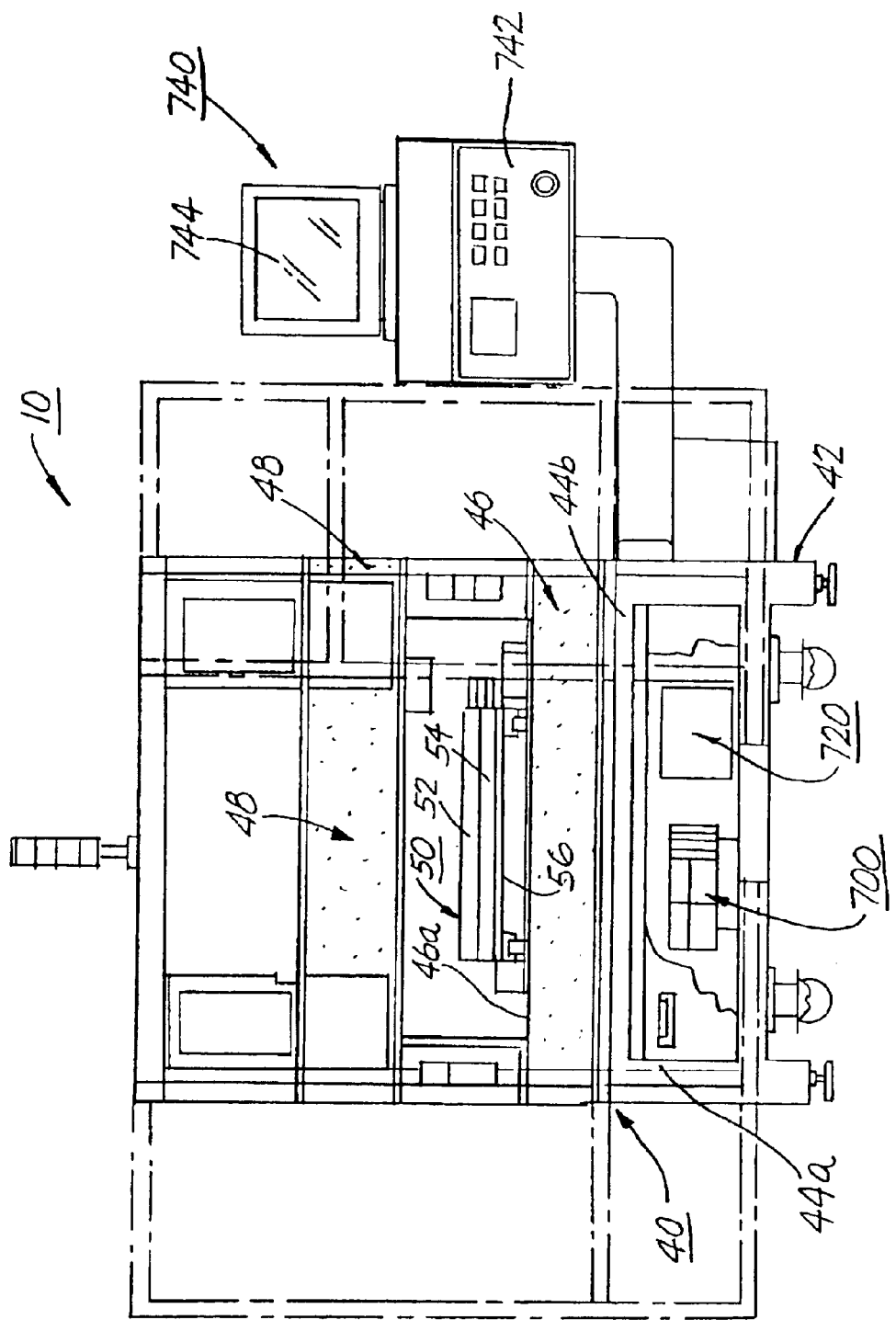
FIG. 1 is a front elevational view of a die bonding apparatus constructed in accordance with the present invention.
Figure 2:
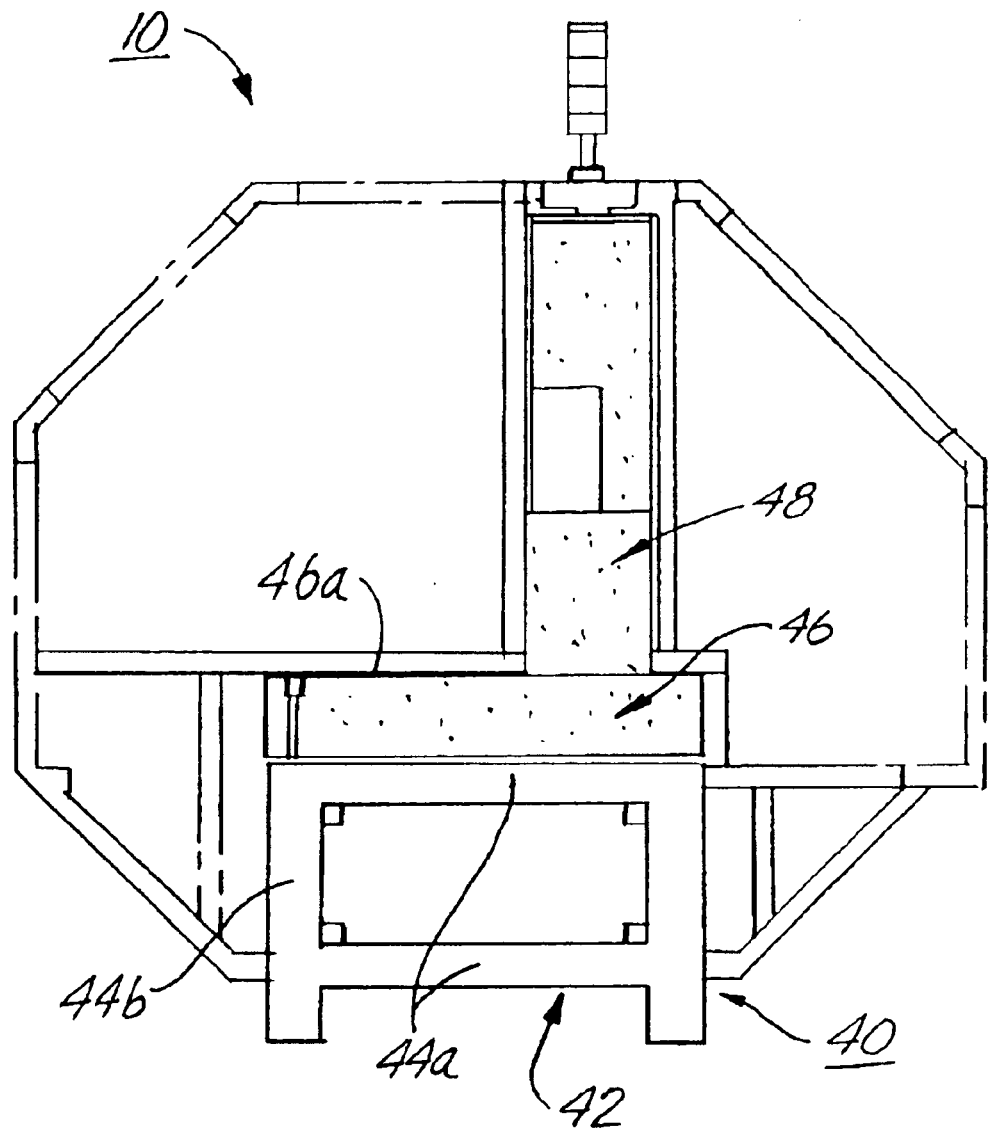
FIG. 2 is a side elevational view of the die bonding apparatus shown in FIG. 1.
Figure 3:
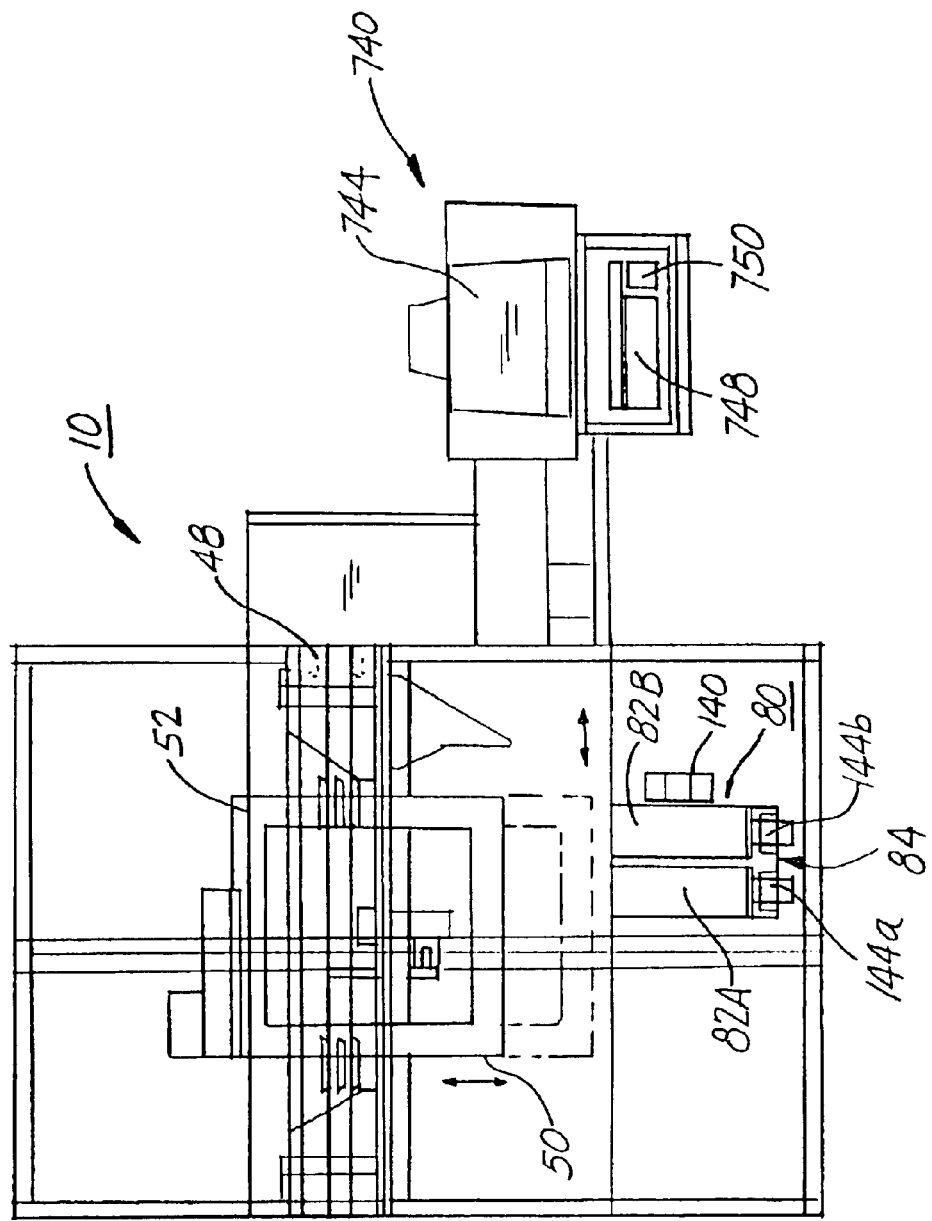
FIG. 3 is a top plan view of the die bonding apparatus shown in FIGS. 1 and 2.
Figure 25:
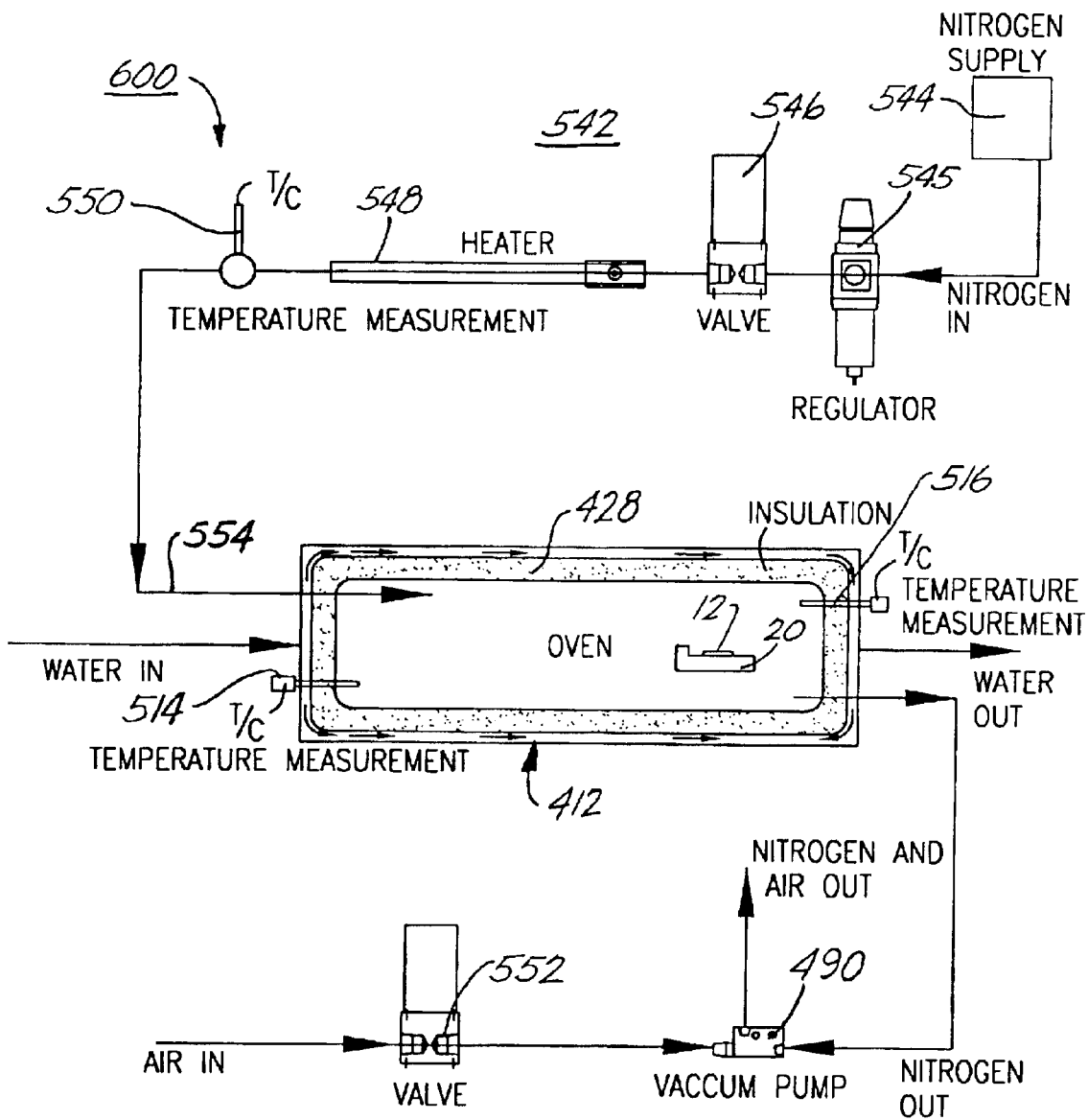
FIG. 25 is a schematic diagram of a fluxless reflow process in accordance with the present invention.

With reference to FIGS. 1–3, there is shown a flip chip die bonder apparatus or bonding system 10. As will be discussed in greater detail hereinafter, the die bonder apparatus 10 is adapted for precise alignment/mounting/bonding of flipped dies or semiconductor components 12 to substrate members 20 (see FIG. 26) in making optoelectronic assemblies 30. More particularly, the die bonder apparatus 10 is adapted to carry out a batch fluxless reflow (i.e., soldering) process 600 (see FIG. 25) for bonding the dies 12 to the substrate members 20 with the use of eutectic solders 610 (see FIG. 26). To facilitate consideration and discussion, the dies 12 and the substrate members 20 will be briefly described below, followed by a discussion of the construction of the die bonder apparatus 10.

Figure 5:
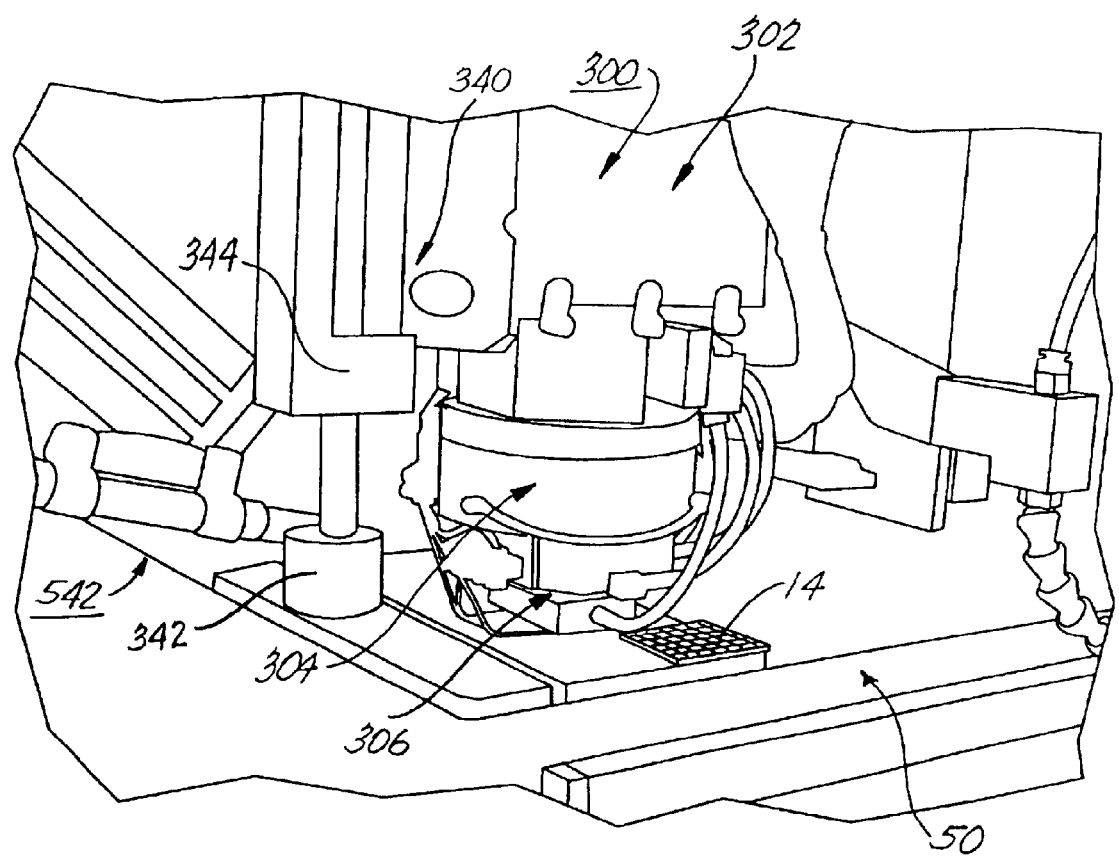
FIG. 5 is an enlarged perspective view of the bonding head assembly shown in FIG. 4.
Figure 6:
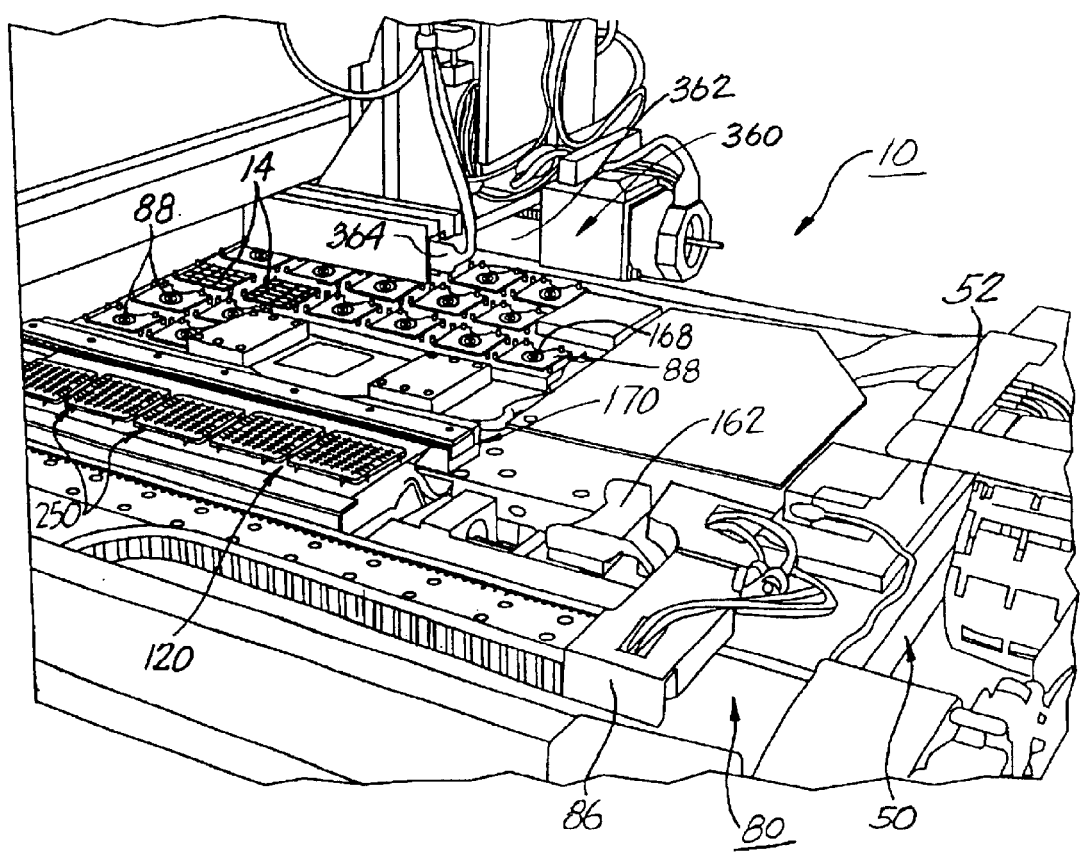
FIG. 6 is a perspective view of a portion of the die bonding apparatus shown in FIGS. 1–3, illustrating a die feeding assembly and an optical X, Y and Z sub-assembly of the die bonding apparatus.
Figure 26:
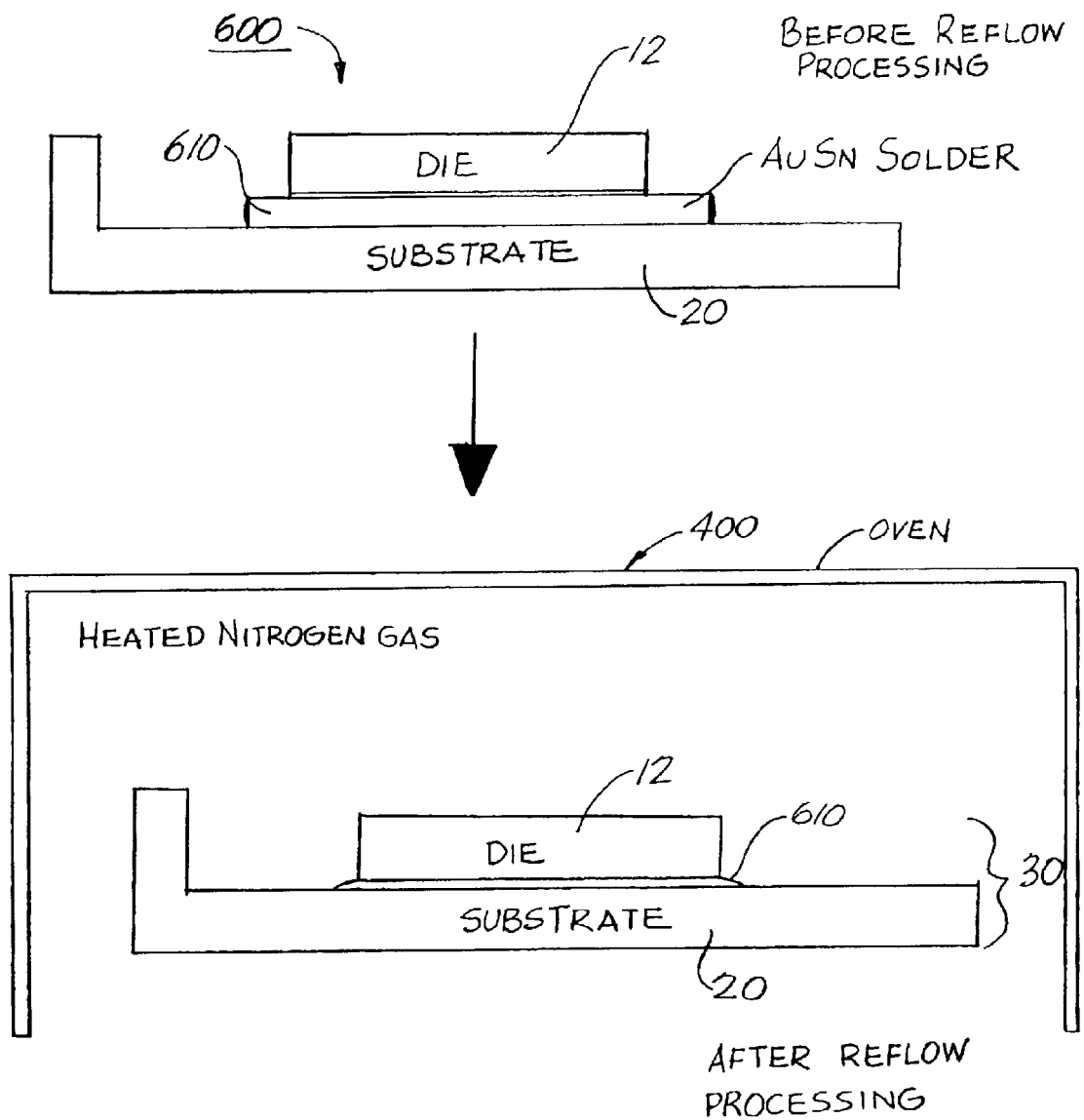
FIG. 26 is a schematic view of a substrate and a die undergoing the reflow process illustrated in FIG. 25.

Referring primarily to FIGS. 5, 6 and 26, the dies 12 are preferably pre-formed and are transported in waffle/gel packs or trays 14 designed to protect the dies 12 during transportation, processing, inspection and assembly. The dies 12 can be picked up on demand. More particularly, with vacuum drawn under the trays 14, removal of each of the dies 12 is easily accomplished by using die pick up tools or vacuum pick-up tools. Like the dies 12, the substrate members 20 are preferably pre-made and transported to the die bonder apparatus 10 for assembly. Each of the substrate members 20 includes an upper wall surface 22, a bottom wall surface 24, side wall surfaces 26a–26d and corner edges 28a–28d (see FIGS. 10A and 10B).

The die bonder apparatus 10 includes a main machine base assembly 40 (see FIGS. 1–3), an X-Y substrate stage assembly 50 (see FIGS. 3 and 4), die and substrate feeding assemblies 80, 81 (see FIGS. 6–8), a bonding head assembly 300 (see FIGS. 4 and 5), an optical system assembly 340 (see FIG. 5) having an optical X, Y and Z sub-assembly 360 (see FIG. 6), an integrated two-stage reflow oven/furnace assembly 400 (see FIGS. 4 and 17–24), an electronic control system 700 (see FIG. 1), an electro-pneumatic control system 720 (see FIG. 1) and a computer control system 740 (see FIGS. 1 and 3). The construction and operation of each of these components of the die bonder apparatus 10 will be described in greater detail hereinafter.

Referring primarily to FIGS. 1–3, the main machine base assembly 40 includes a frame assembly 42 having horizontal and vertical bar members 44a, 44b for supporting various components of the die bonder apparatus 10 (e.g., the X-Y substrate stage assembly 50, the substrate feeding assembly 81, the bonding head assembly 300, the optical system assembly 340, the integrated reflow oven assembly 400, the electronic control system 700, the electro-pneumatic control system 720 and the computer control system 740). The base assembly 40 also includes a system base 46, which is equipped with an upper wall surface 46a (see FIGS. 1 and 2) having a substantially rectangular shape and preferably made from a granite material. The granite system base 46 is used for imparting stability to components of the die bonder apparatus 10 supported thereby, including movable components and assemblies that are guided by high-precision bearings (not shown), resulting in a reliable bonding process. The granite system base 46 also provides rigidity and stability to the bonder apparatus 10, as required in performing a repeated, high-force bonding operation. The granite system base 46 is especially suitable for applications with high input and output (I/O) counts and/or for applications using adhesive materials that cure relatively fast under high bonding forces (e.g., up to 100 Kg). Alternatively, the system base 46 can be made from other materials. The system base 46 includes an upper granite bridge 48 attached (e.g., bolted) to the system base 46. The upper granite bridge 48 is adapted for supporting the bonding head assembly 300 (see FIGS. 4 and 5), as well as various components of the optical system assembly 340 (see FIG. 6).

Figure 4:
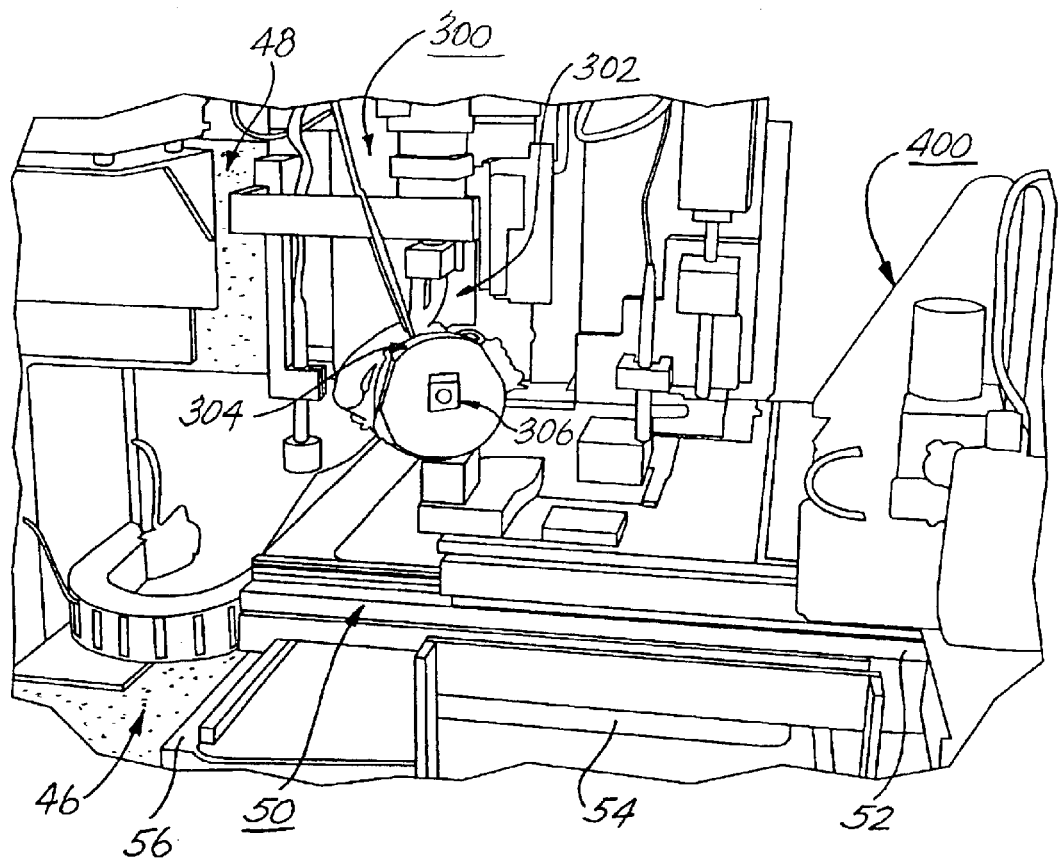
FIG. 4 is a perspective view of a portion of the die bonding apparatus shown in FIGS. 1–3, illustrating a bonding head assembly, an optical system assembly, an integrated reflow oven assembly and an X-Y substrate stage assembly of the die bonding apparatus.
Figure 17:
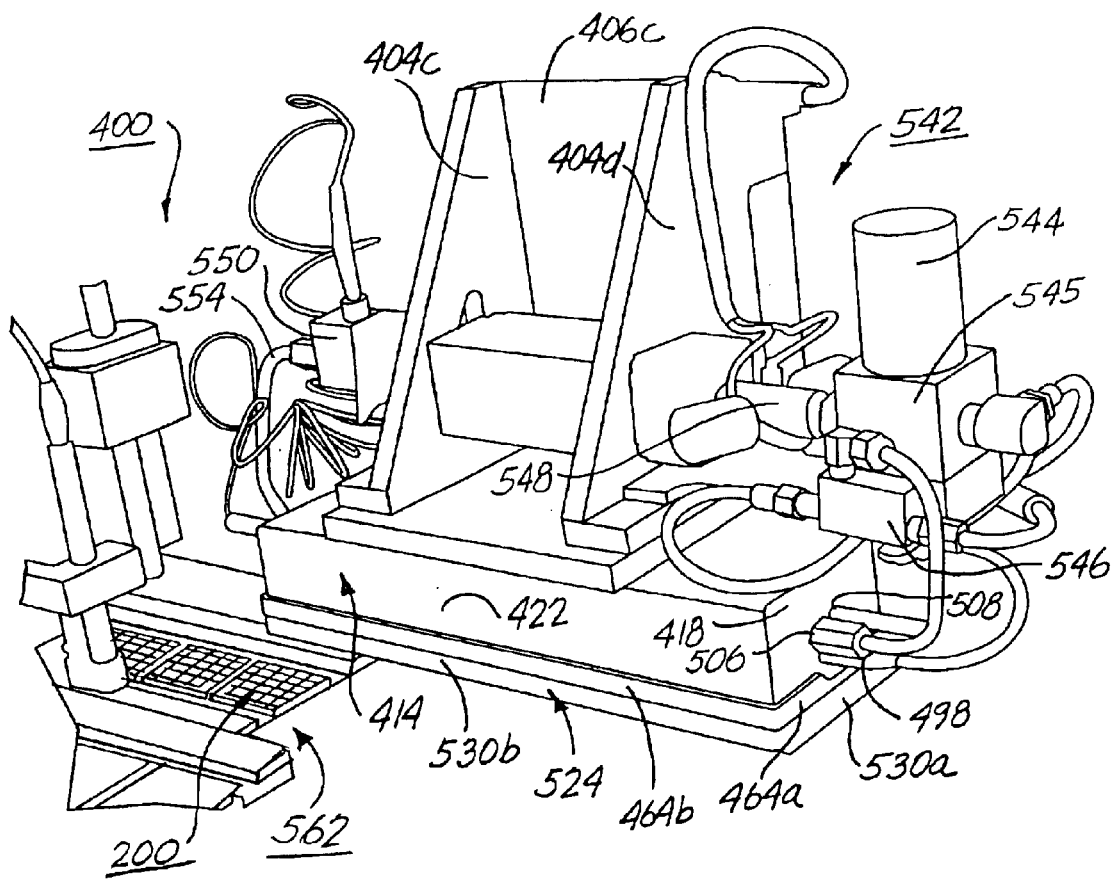
FIG. 17 is a perspective view, looking from above, of the reflow oven assembly shown in FIG. 4.

With reference to FIGS. 3 and 4, the X-Y substrate stage assembly 50 is adapted to house or support various components of the die feeding assembly 80, the bonding head assembly 300 and the integrated reflow oven assembly 400 (see FIG. 17). More particularly, the X-Y substrate stage assembly 50 includes an upper X-stage 52, a middle Y-stage 54 and a lower stationary platform 56. The X-Y substrate stage assembly 50 also includes an X-stage motor assembly 58 (see FIG. 6), a Y-stage motor assembly 60 (see FIG. 6) and an optical orientation assembly 362 (see FIG. 6). The X-stage 52 is movable in an X-axis direction by the X-stage motor assembly 58, while the Y-stage 54 is movable in a Y-axis direction by the Y-stage motor assembly 60. Any conventional range of movement and/or resolution can be adopted for the X-stage 52 and the Y-stage 54. The lower stationary platform 56 of the X-Y substrate stage assembly 50 is attached to the upper wall surface 46a of the system base 46.

Figure 7:
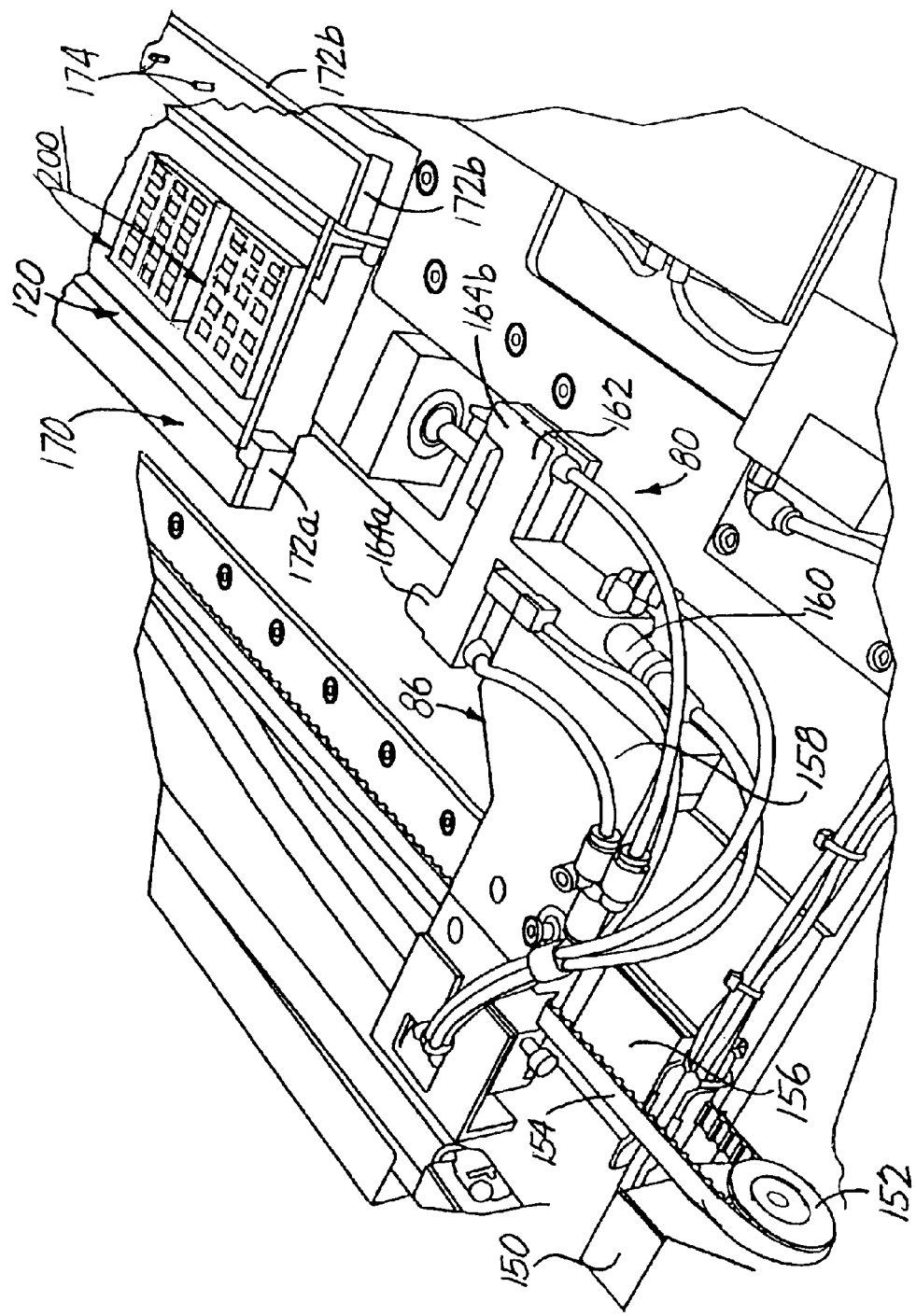
FIG. 7 is a perspective view of a portion of the die bonding apparatus shown in FIGS. 1–3, illustrating a gripper sub-assembly and a carrier guide member of the die bonding apparatus.
Figure 8:
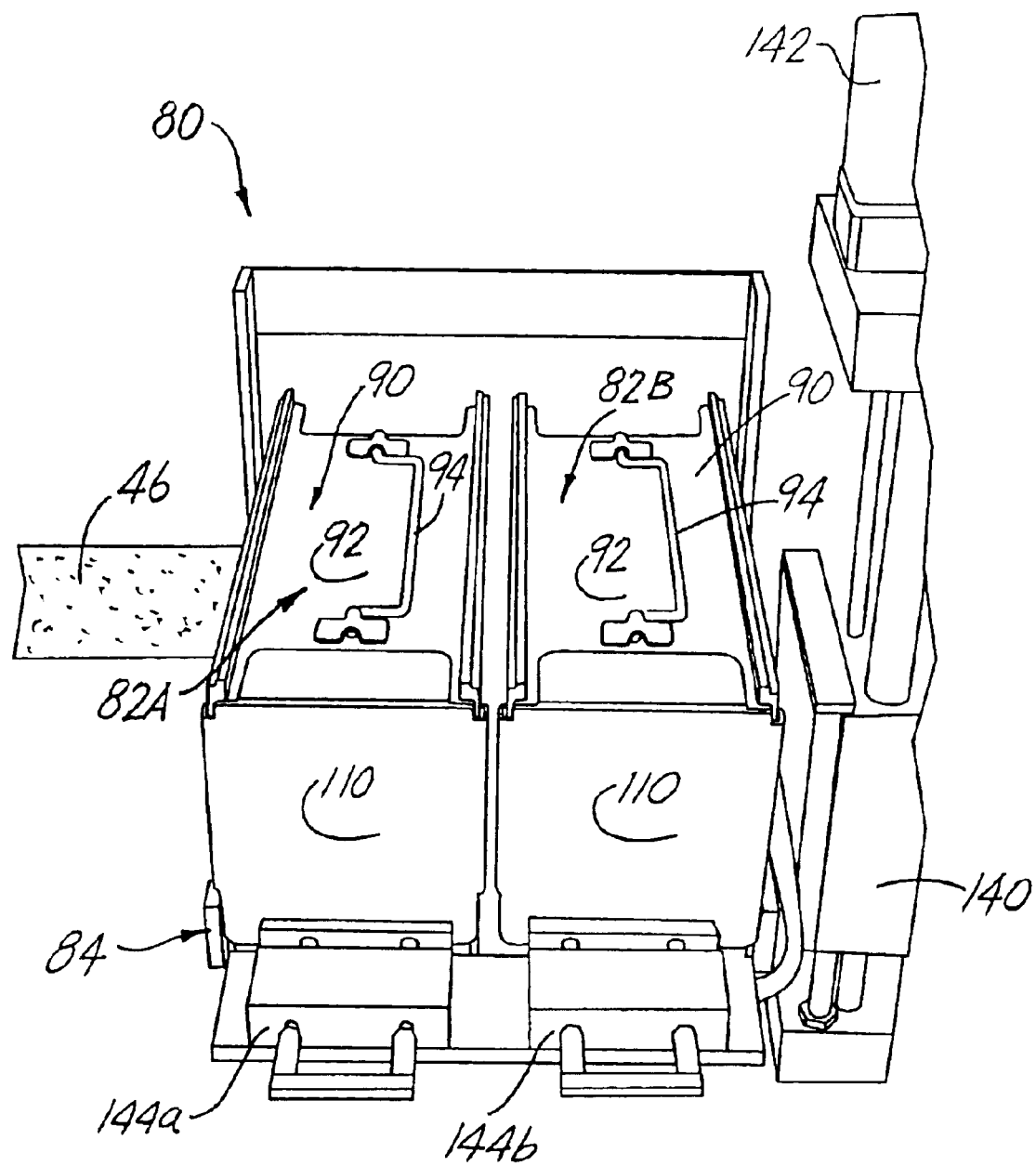
FIG. 8 is a perspective view of a substrate feeding assembly of the die bonding apparatus shown in FIGS. 1–3.
Figure 8A:
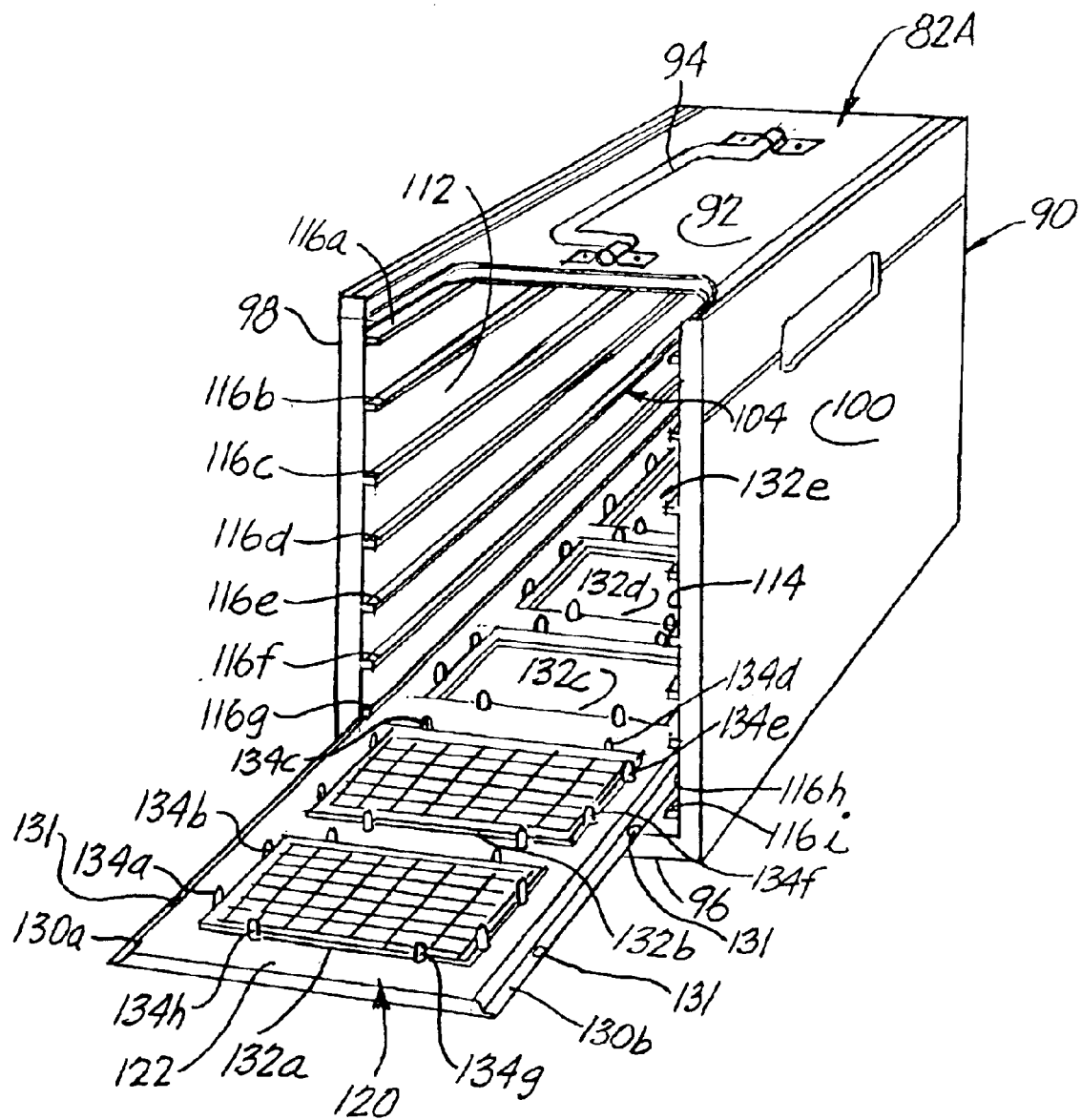
FIG. 8A is a perspective view of a magazine holder of the substrate feeding assembly shown in FIG. 8.

The die and substrate feeding assemblies 80, 81 are provided with a pair of magazine holders 82A and 82B, a magazine loader 84, a gripper sub-assembly 86, a plurality of waffle/gel pack or tray holders 88 and a carrier guide member 170 (see FIGS. 3 and 6–8A). Each of the magazine holders 82A and 82B, which are located adjacent to a front side of the die bonder apparatus 10 (see FIG. 3), includes a housing body 90. Referring to FIGS. 8 and 8A, each of the housing bodies 90 include a top wall 92, which has a carrying handle 94 thereon, a bottom wall 96 and side walls 98, 100, cooperating to form an interior compartment 102 having a front opening 104 and a rear opening. Each of the housing bodies 90 also includes a front cover and a rear cover 110 sized and shaped so as to cover the front opening 104 and the rear opening, respectively. Interior surfaces 112, 114 of the side walls 98, 100, respectively, are provided with a plurality of support ledges 116a–116i.

Now referring to FIG. 8A, the die bonder apparatus 10 is also provided with carrier members or boats 120. More particularly, each of the carrier members 120 includes a carrier housing 122, which preferably has a rectangular shape and which is made from a metal, such as stainless steel. Each of the carrier housings 122 includes a pair of longitudinal extension guides 130a, 130b having a plurality of mounting openings 131 therein. The extension guides 130a, 130b of the carrier members 120 are sized and shaped so as to releasably engage a corresponding set of the support ledges 116a–116i of the magazine holders 82A, 82B for loading the carrier members 120 into a corresponding one of the interior compartments 102 of the magazine holders 82A, 82B. Each of the carrier housings 122 is also equipped with a plurality of array openings 132a–132e, each of which has a substantially rectangular shape. Retainer posts 134a–134h are arranged around each of the array openings 132a–132e for purposes to be discussed hereinafter.

As shown in FIGS. 3 and 8, the magazine loader 84, which is located adjacent to the X-Y stage assembly 50, includes a magazine elevator 140, an elevator motor 142 and a pair of clamping members 144a, 144b. The magazine elevator 140 is adapted for moving the magazine loader 84 in the Z-axis direction in order for the gripper sub-assembly 86 (see FIG. 7) to grip and unload the carrier members 120 from the magazine holder 82A or the magazine holder 82B for a bonding process. The clamping member 144a, 144b are sized and shaped so as to engage the magazine holders 82A and 82B, respectively, for securing same to the magazine loader 84.

Now referring to FIGS. 6 and 7, the gripper sub-assembly 86, which is mounted to the upper X-stage 52 of the X-Y stage assembly 50, includes a gripper motor 150, a gripper drive pulley 152, a gripper belt 154 and a gripper ball slide 156. The gripper sub-assembly 86 is also provided with a gripper housing 158, a gripper air cylinder 160, and a gripper member 162 having a pair of holders or grippers 164a, 164b at ends thereof. The holders 164a, 164b of the gripper member 162, which is movably mounted on the X-stage 52, are adapted for holding one end of a selected one of the carrier members 120 in order to unload same from the magazine loader 84 and then position same onto the carrier guide member 170.

With reference to FIGS. 5 and 6, the waffle/gel pack or tray holders 88 are adapted to receive thereon the waffle/gel packs 14 containing the dies 12. More particularly, the tray holders 88 are mounted on the X-stage 52 of the X-Y stage assembly 50 and are hence movable therewith. Each of the tray holders 88 preferably has a square shape, as well as a vacuum opening 168 therein for releasably securing a corresponding one of the waffle/gel packs 14 thereon.

Now referring back to FIGS. 6 and 7, the carrier guide member 170 is mounted on the X-stage 52 of the X-Y stage assembly 50 adjacent to the tray holders 88. More particularly, the carrier guide member 170 includes a pair of carrier guide supports 172a, 172b, each of which has mounting tabs 174 projecting therefrom for retaining one of the carrier members 120 on the carrier guide member 170. Each of the mounting tabs 174 is sized and shaped so as to be received in a corresponding one of the mounting openings 131 (see FIG. 8A) of the longitudinal extension guides 130a, 130b of the carrier members 120.

The bonding head assembly 300 (see FIGS. 4 and 5) is constructed and operates in a manner similar to that of a conventional bonding head assembly. For instance, the bonding head assembly 300, which is positioned at a die placing station on the apparatus 10, includes a housing sub-assembly 302, a pitch and roll sub-assembly 304 and an upper chuck sub-assembly 306. The housing sub-assembly 302 is adapted to house various electronic, pneumatic and/or mechanical components (e.g., motors, manifolds, vacuum ejectors and camera components) of the bonding head assembly 300. The pitch and roll sub-assembly 304, which is a leveling mechanism adapted for eliminating or reducing planarity errors, is connected to a lower end of the housing sub-assembly 302. The upper chuck sub-assembly 306, which is attached to the pitch and roll sub-assembly 304, is adapted to hold a die pickup tool (not shown) for picking up an individual die 12 from the waffle/gel packs 14 located on the tray holders 88. The upper chuck sub-assembly 306 is also adapted to heat a die 12 picked up thereby. In this regard, the upper chuck sub-assembly 306 is provided with a heater element, a cooling jacket and a vacuum holder (not shown).

With reference to FIGS. 5 and 6, the optical system assembly 340 is constructed and operates in a manner similar to that of a conventional optical system assembly. For instance, the optical system assembly 340 includes a plurality of optical cameras 342 and a lamp house member 344. The optical system assembly 340 is adapted to locate a selected one of the dies 12 and to then determine its orientation within the waffle/gel pack 14. Moreover, the optical system assembly 340 is adapted to determine the orientation of the die 12 relative to a corresponding one of the substrate members 20 for proper mounting/alignment of the die 12 to the substrate member 20.

Referring to FIG. 6, the optical X, Y and Z stage sub-assembly 360, which has a construction and operation similar to those of a convention optical X, Y and Z stage sub-assembly, is designed to operate the optical system assembly 340. For instance, the optical X, Y and Z stage sub-assembly 360 includes an optical stage 362 selectively movable in the X-axis, Y-axis and Z-axis directions, as well as an optical probe 364 for achieving high precision alignment between the individual dies 12 and the substrate members 20.

With reference to FIG. 1, the electronic control system 700 is adapted for controlling the operation of the die bonder apparatus 10. More particularly, the electronic control system 700 is provided with various electronic/electrical components (e.g., control modules, a main power supply, solid state relays, servomotors, servomotor controllers and other conventional electronic components) for controlling the operation of the components of the die bonder apparatus 10 (e.g., the X-Y substrate stage assembly 50, the die and substrate feeding assemblies 80, 81, the bonding head assembly 300, the optical X, Y and Z sub-assembly 360 and the reflow oven assembly 400).

Referring to FIGS. 1 and 7, the electro-pneumatic control system 720 is adapted for controlling the electro-pneumatic operation of various components of the die bonder apparatus 10 (e.g., the X-Y substrate stage assembly 50, the die and substrate feeding assemblies 80, 81, the bonding head assembly 300, the optical X, Y and Z sub-assembly 360 and the reflow oven assembly 400). More particularly, the electro-pneumatic control system 720 is adapted to supply pressurized air from an air compressor or source (not shown) to such components for powering various air cylinders and air solenoid valves so as to operate same.

As shown in FIGS. 1 and 3, the computer control system 740 has a construction and operation similar to those of a conventional computer control system used in the flip chip bonding field. For instance, the computer control system 740 includes a microprocessor 742, a monitor 744, which has a user interface and a keyboard 748 provided with a mouse 750. The microprocessor 742 is adapted to set and/or control various operating parameters of the die bonder apparatus 10. These parameters include temperature, pressure, movement, power, time, force, vacuum, optical positioning, planarity, etc. The die bonder apparatus 10 is operable through a Windows-type user interface having two operating levels. The first level is an operator level for instructing the die bonder apparatus 10 to complete pre-determined operational steps for multi-step processes, such as force variations, distance bonding and temperature ramping. The second level is an engineering level for instructing the die bonder apparatus 10 to perform auto-diagnostics, data logging, die orientation analysis, etc. Alternatively, other types of user interface can be used in connection with the computer control system 740.

FIGS. 10–13 show a vacuum substrate chuck array 200 adapted for use in connection with the die bonder apparatus 10 and/or a conventional die bonder apparatus. More particularly, the vacuum substrate chuck array 200 is adapted to receive and carry thereon an array of the substrate members 20 (see FIGS. 10A and 10B). In this regard, the vacuum substrate chuck array 200 includes a top plate member 202 and a bottom plate member 222, both of which are made from a metal, such as stainless steel. The top plate member 202 is provided with a substantially planar upper exterior wall surface 204, a substantially planar bottom interior wall surface 206 and side wall surfaces 208a–208d. The top plate member 202 also includes a plurality of openings 210 extending completely therethrough in a direction substantially perpendicular to the upper exterior wall surface 204, as well as the bottom interior wall surface 206. Each of the openings 210, which are preferably formed by a conventional milling process, is defined by a substantially straight wall 211 (see FIG. 10B) oriented substantially vertically and hence substantially perpendicular to the upper exterior wall surface 204. Each of the openings 210 is also provided with secondary openings 212a–212d formed at corner edges thereof for receiving the corner edges 28a–28d, respectively, of a corresponding one of the substrate members 20 (see FIGS. 10A and 10B). Slots 214a, 214b extend laterally outwardly from each of the openings 210 for receiving pincers 62a, 62b, respectively, of a tweezer 60 when a substrate member 20 is placed or removed from a corresponding one of the openings 210 with the use of the tweezer 60 (see FIG. 10A). The secondary openings 212a–212d and/or the slots 214a, 214b are preferably formed by a conventional drilling process. Mounting holes 216a–216h are also provided in the top plate member 202 and are located along the side wall surfaces 208a–208d (see FIGS. 10 and 11). The openings 210, the secondary openings 212a–212d and/or the slots 214a–214b can also be formed by other conventional processes (e.g., a wire electrical discharge machining (EDM) process).

Still referring to FIGS. 10–13, the bottom plate member 222 includes an upper interior wall surface 224, a bottom exterior wall surface 226 and side wall surfaces 228a–228d. The bottom plate member 222 is also provided with a plurality of raised platforms 230, which are arranged in an array of columns and rows (see FIGS. 10B and 11). More particularly, the raised platforms 230 are preferably formed by milling a rectangularly shaped block of metal, such as stainless steel. Alternatively, other processes can be used in forming the raised platforms 230. Each of the raised platforms 230 has a substantially rectangular shape and includes a substantially flat or straight top surface 232 and side surfaces 234a–234d (see FIG. 11). Moreover, each of the raised platforms 230 is sized and shaped so as to be received in a corresponding one of the openings 210 of the top plate member 202 for purposes to be discussed hereinafter. Vacuum openings 236a, 236b extend completely through each of the raised platforms 230. Mounting holes 238a–238h are also formed in the bottom plate member 222 along the side wall surfaces 228a–228d such that mounting bolts 218 can extend through the mounting holes 238a–238h of the bottom plate member 222 and the mounting holes 216a–216h, respectively, of the top plate member 202 for removably attaching the bottom plate member 222 to the upper plate member 202.

Figure 12:
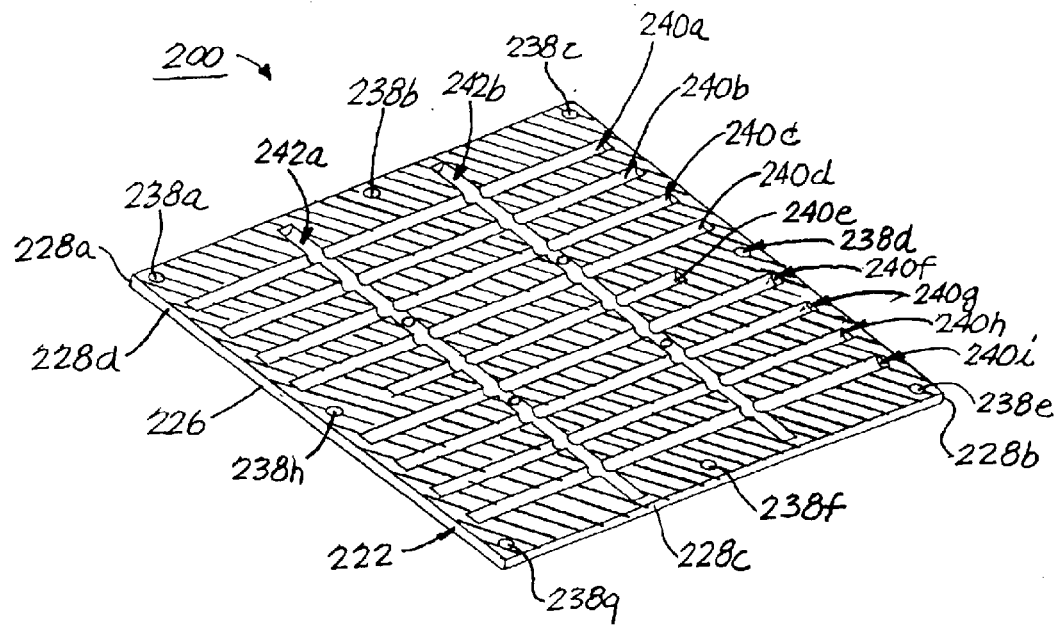
FIG. 12 is a cross-sectional view, taken along section line 12—12, of a bottom plate member of the vacuum substrate chuck array shown in FIG. 11.
Figure 13:
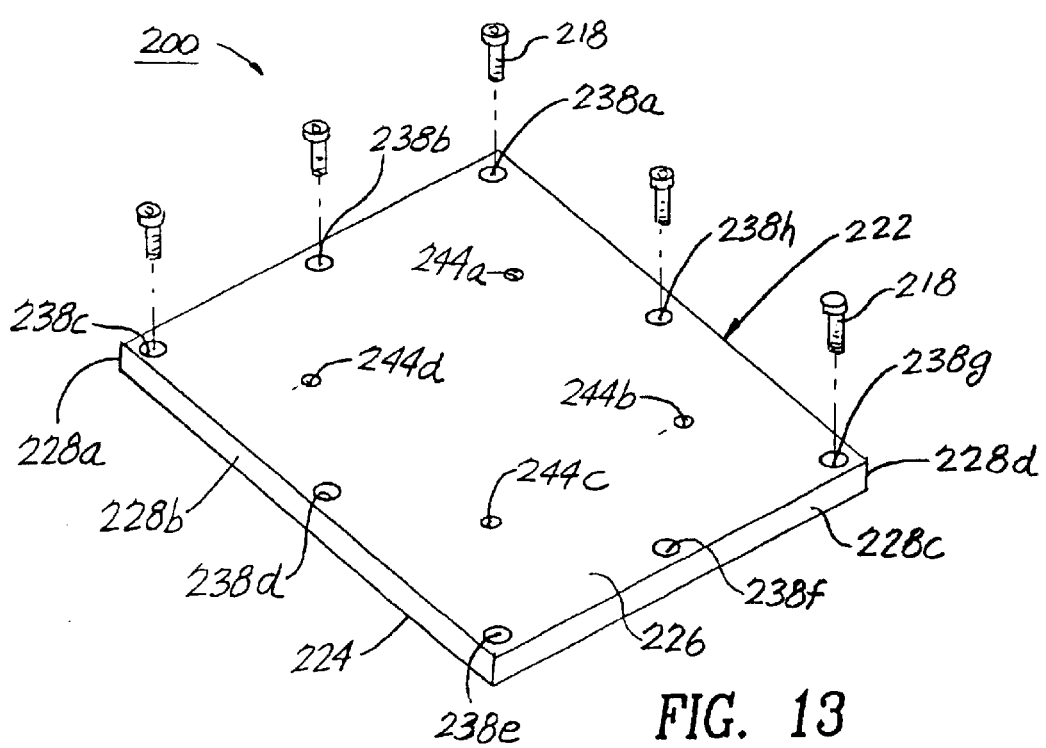
FIG. 13 is a perspective view of the bottom plate member of the vacuum substrate chuck array shown in FIG. 11.

Referring primarily to FIG. 12, the bottom plate member 222 is also provided with a plurality of Y-axis channels 240a–240i and a pair of X-axis channels 242a, 242b formed within the bottom plate member 222. More particularly, the Y-axis channels 240a–240i and the X-axis channels 242a, 242b are formed by drilling the bottom plate member 222 with a conventional drill prior to or subsequent to the formation of the raised platforms 230 and then plugging open ends of the drilled holes with plugs 243 (see FIG. 10B) in an air-tight fashion. The Y-axis channels 240a–240i intersect the X-axis channels 242a, 242b such that the Y-axis channels 240a–240i and the X-axis channels 242a, 242b are in communication with one another. Further, each of the Y-axis channels 240a–240i communicates with the vacuum openings 236a, 236b of a corresponding one of the raised platforms 230 (see FIG. 10B) for purposes to be discussed hereinafter. The bottom exterior wall surface 226 of the bottom plate member 222 includes a plurality of vacuum openings or orifices 244a–244d (see FIG. 13). The vacuum openings 244a, 244b and the vacuum openings 244c, 244d communicate with the X-axis channels 242a, 242b, respectively, and hence with the Y-axis channels 240a–240i.

Figure 9A:
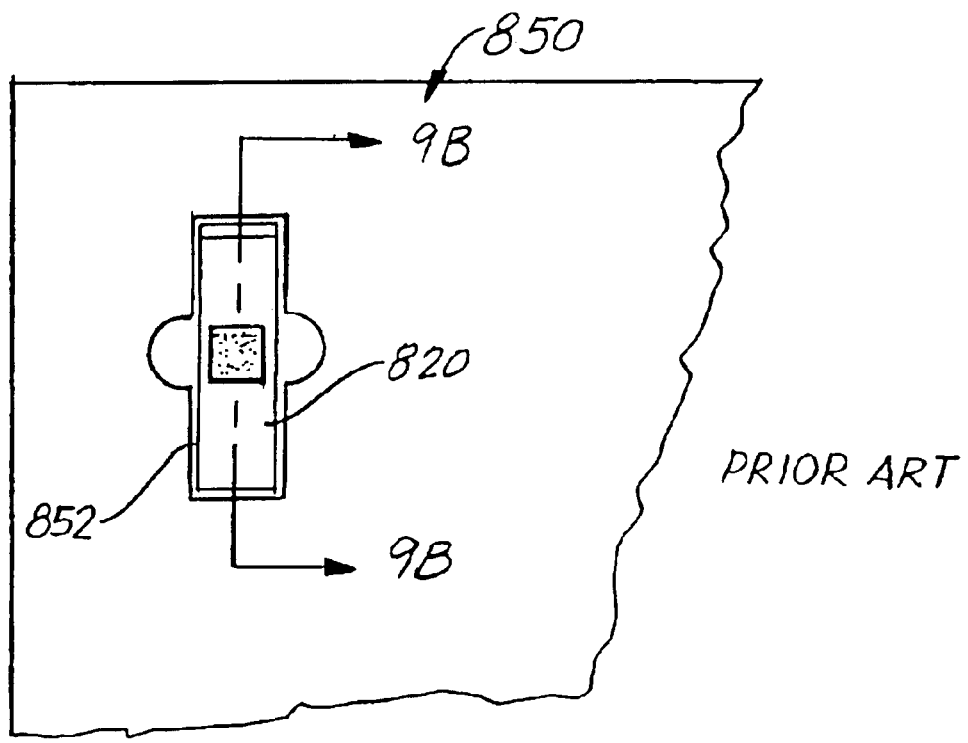
FIG. 9A is a top plan view of a portion of a conventional vacuum substrate chuck array having a substrate member placed in an opening thereof.
Figure 9B:
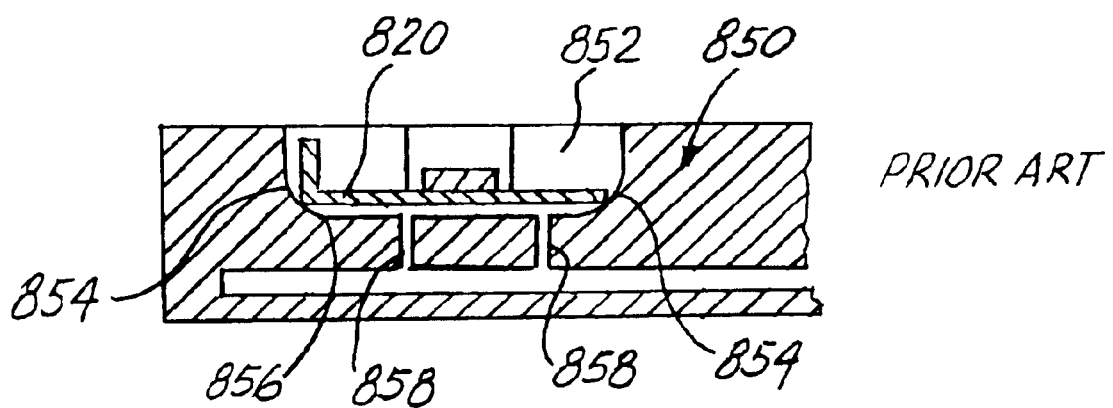
FIG. 9B is a cross-sectional view, taken along section line 9B—9B, of the conventional vacuum substrate chuck array shown in FIG. 9A.
Figure 10:
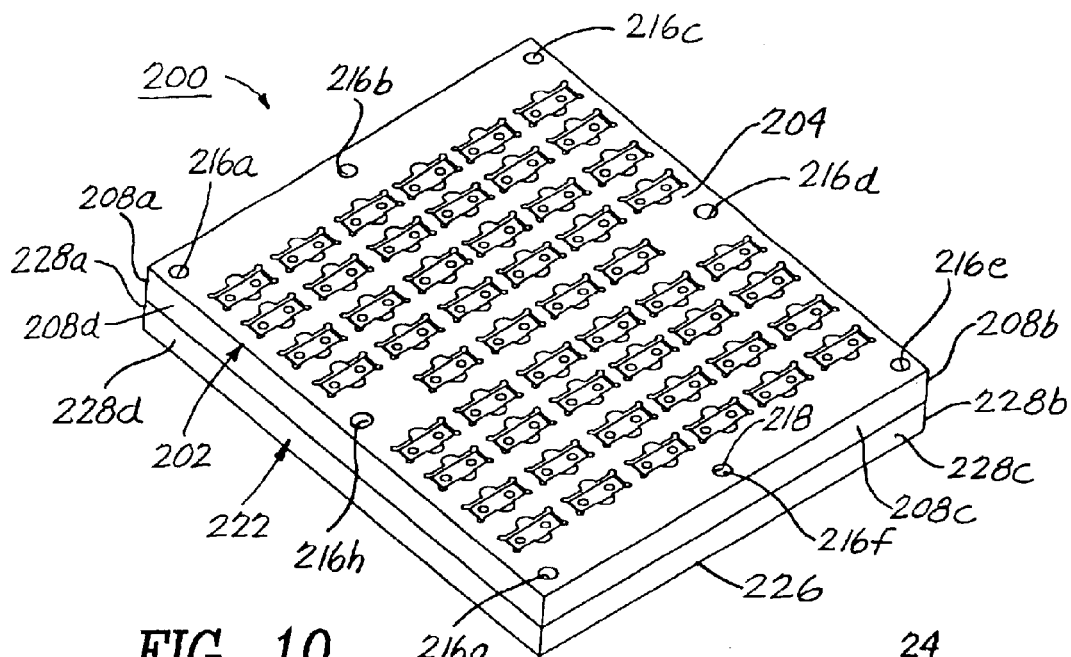
FIG. 10 is a perspective view of a vacuum substrate chuck array constructed in accordance with the present invention.
Figure 10B:
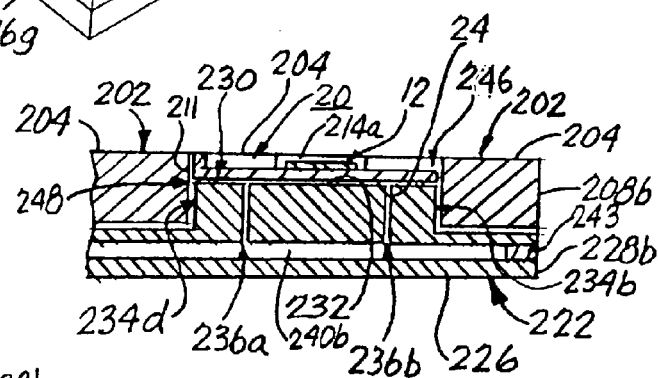
FIG. 10B is a cross-sectional view, taken along section line 10B—10B and looking in the direction of the arrows, of the vacuum substrate chuck array shown in FIG. 10A.
Figure 10A:
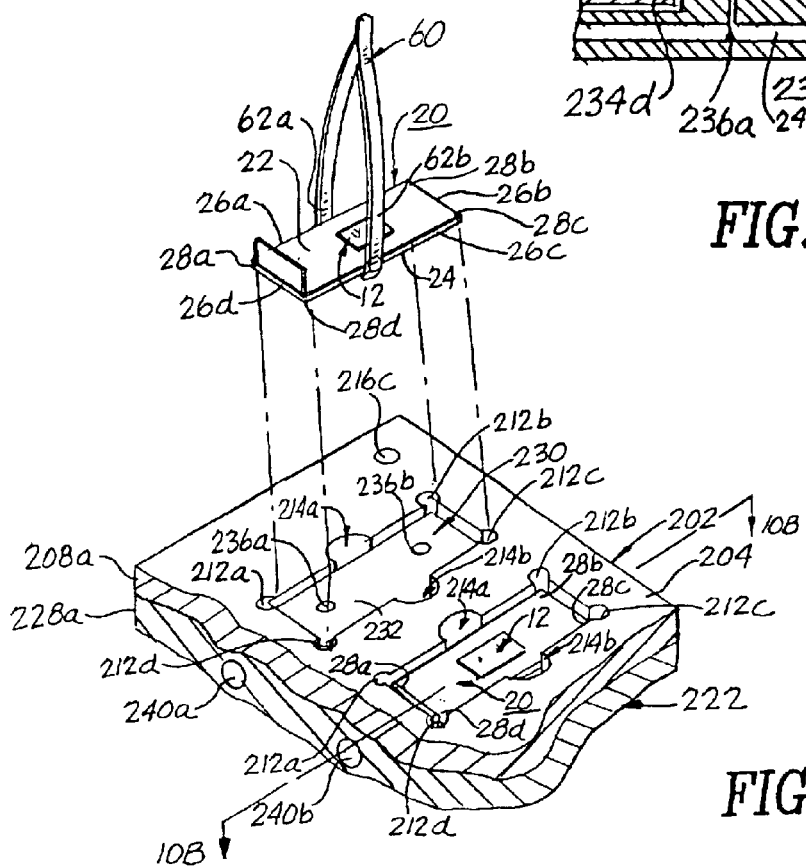
FIG. 10A is an enlarged view of a portion of the vacuum substrate chuck array shown in FIG. 10.
Figure 11:
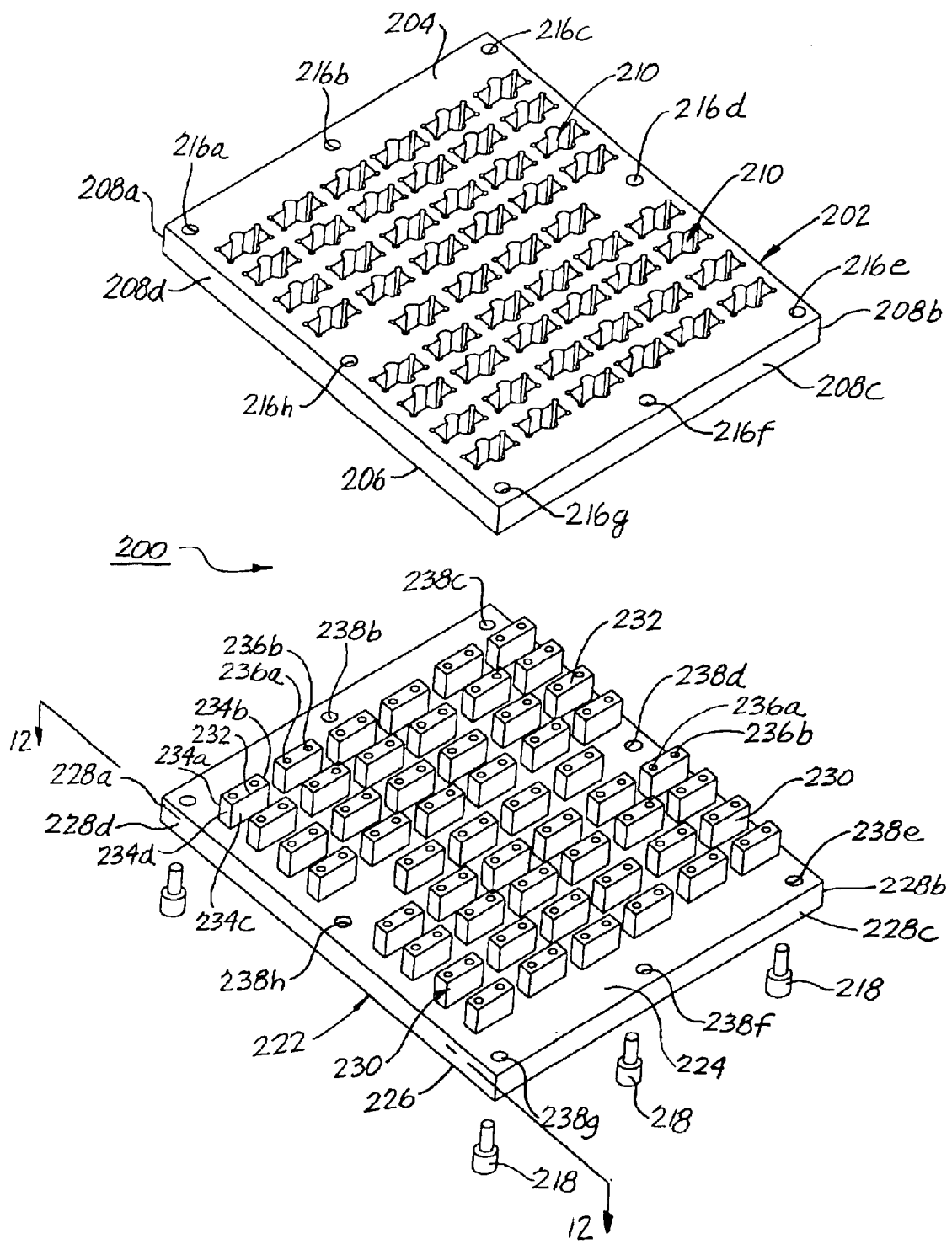
FIG. 11 is an exploded perspective view of the vacuum substrate chuck array shown in FIG. 10.

When the top plate member 202 is properly assembled with the bottom plate member 222 so as to form the vacuum substrate chuck array 200, each of the raised platforms 230 is received in a corresponding one of the openings 210 of the top plate member 202 such that its top surface 232 is located below the upper exterior wall surface 204 of the top plate member 202 (see FIGS. 10–10B). In this manner, each of the top surfaces 232 of the raised platforms 230 cooperates with a corresponding one of the openings 210 of the top plate member 202 so as to define a well 246 sized and shaped so as to receive a substrate member 20 therein. Each of the top surfaces 232 of the raised platforms 230 also cooperates with the wall 211 of a corresponding one of the openings 210 to form a substantially sharp (e.g., right-angled) lower corner 248. As a result, when the substrate members 20 are placed in the wells 246 of the vacuum substrate chuck array 200, they can come in contact or are engageable with the top surfaces 232 of the raised platforms 230, which define bottom ends of the wells 246 (see FIG. 10B). In this regard, because the secondary openings 212a–212d provide additional clearance between the openings 210 of the top plate member 202 and the corner edges 28a–28d of the substrate members 20 (see FIG. 10A), they assist in the loading of the substrate members 20 into the wells 246 of the vacuum substrate chuck array 200, while facilitating the substrate members 20 to lie substantially flat against the top surfaces 232 of the raised platforms 230. In this manner, the substrate members 20 can be gripped more effectively and/or efficiently by suction applied thereto through the vacuum openings 236a, 236b of the raised platforms 230, compared with a conventional vacuum substrate chuck array. More particularly, referring back to FIGS. 9A and 9B, a conventional vacuum substrate chuck array 850 is provided with openings or wells 852 for receiving substrate members 820. Because the openings 852 of the conventional vacuum substrate chuck array 850 are formed with round or angled lower corners 854, they inhibit the substrate members 820 from engaging or coming in contact with bottom surfaces 856 of the openings 852 (i.e., the substrate members 820 are suspended above the bottom surfaces 856 by the round lower corners 854). As a result, application of suction to the substrate members 820 through vacuum openings 858 is rendered inefficient and/or ineffective in the conventional vacuum substrate chuck array 850. With reference to FIGS. 10A and 10B, because the openings 210 extend completely through the top plate member 202 and the bottom ends of the wells 246 are defined by the top surfaces 232 of the raised platforms 230, substantially right angled bottom corners 248 are formed, facilitating the substrate members 20 to lie substantially flat against the raised platforms 230 such that suction can be applied thereto more effectively and/or efficiently.

Figure 14:
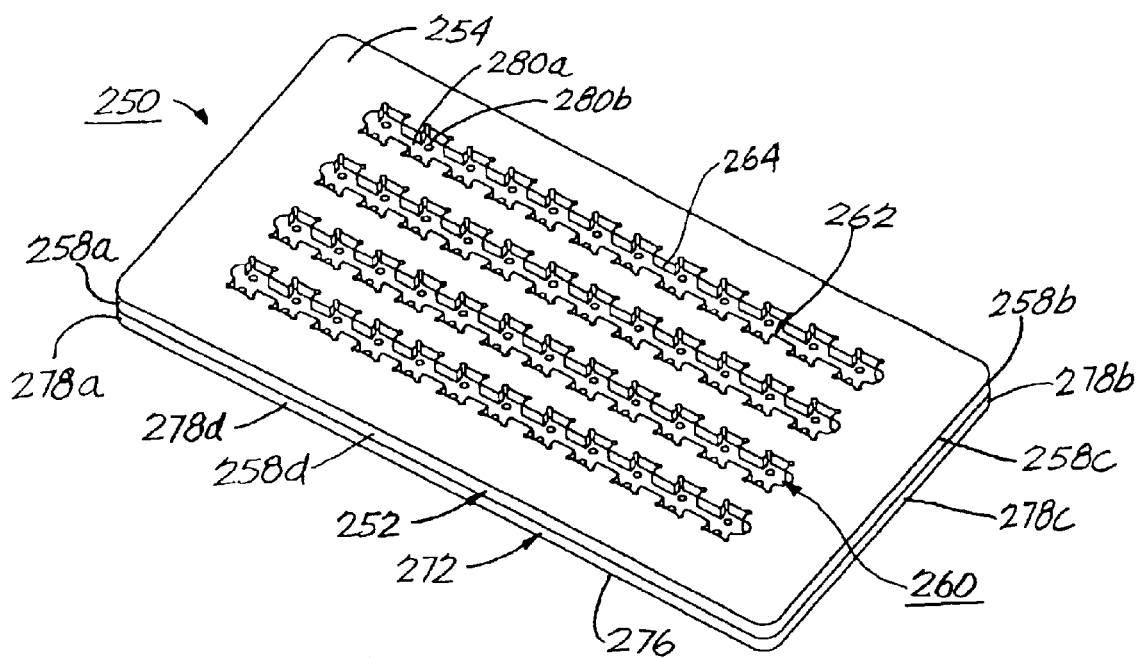
FIG. 14 is a modified vacuum substrate chuck array constructed in accordance with the present invention.
Figure 14B:
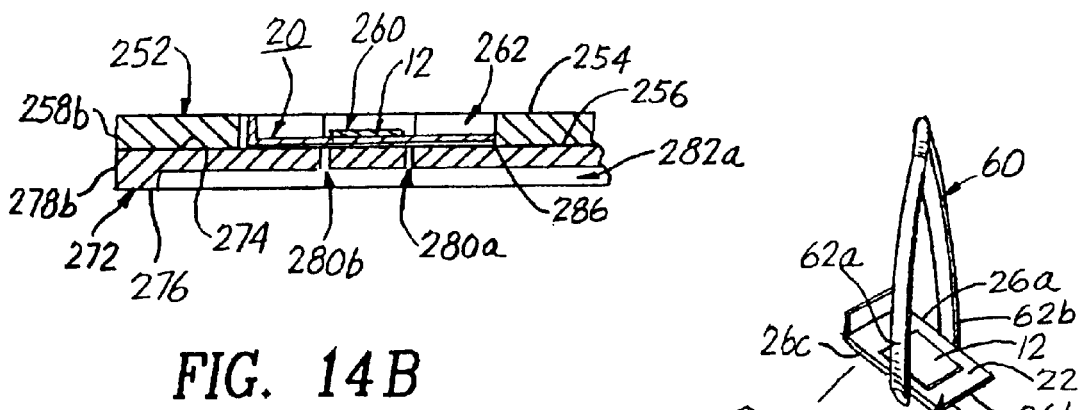
FIG. 14B is a cross-sectional view, taken along section line 14B—14B and looking in the direction of the arrows, of the vacuum substrate chuck array shown in FIG. 14A.
Figure 14A:
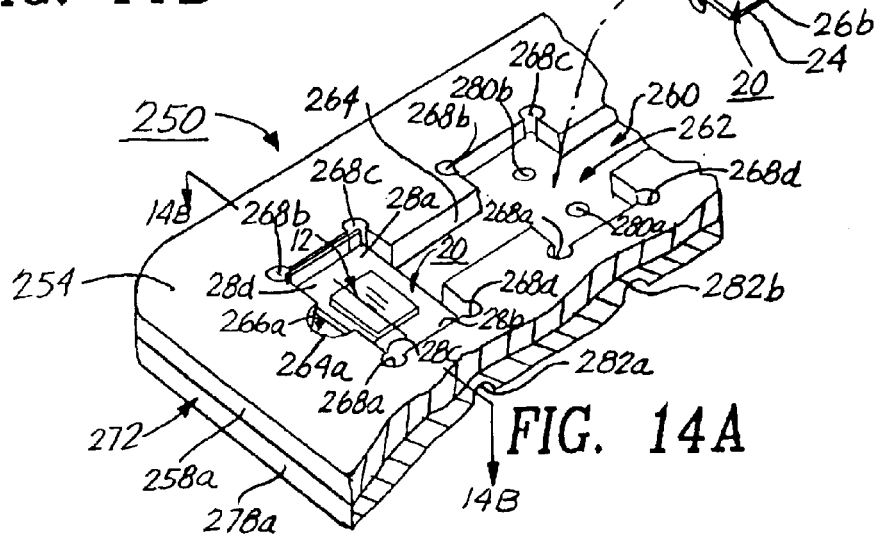
FIG. 14A is a perspective view of a portion of the vacuum substrate chuck array shown in FIG. 14.
Figure 15:
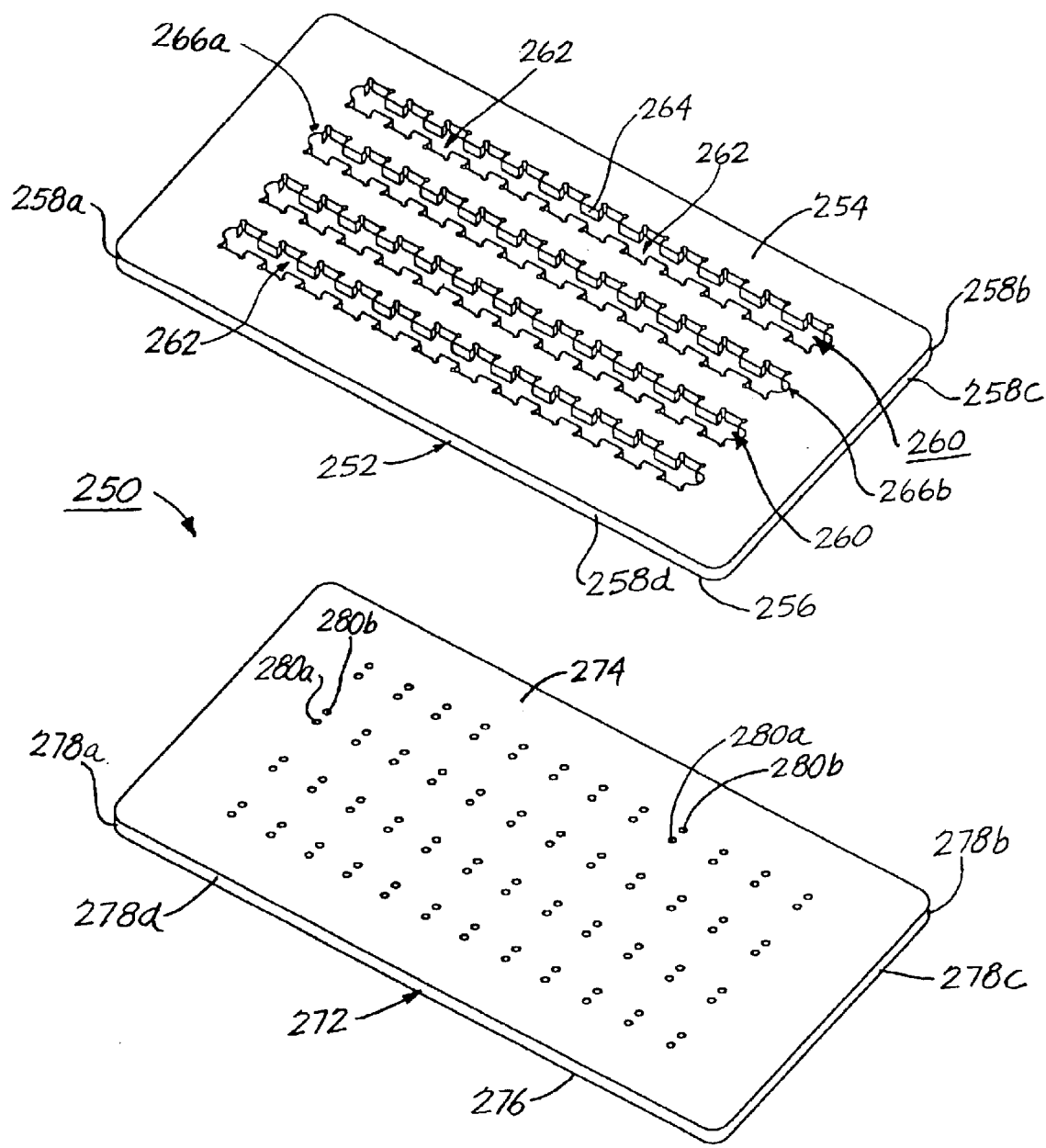
FIG. 15 is an exploded perspective view of the vacuum substrate chuck array shown in FIG. 14.
Figure 16:
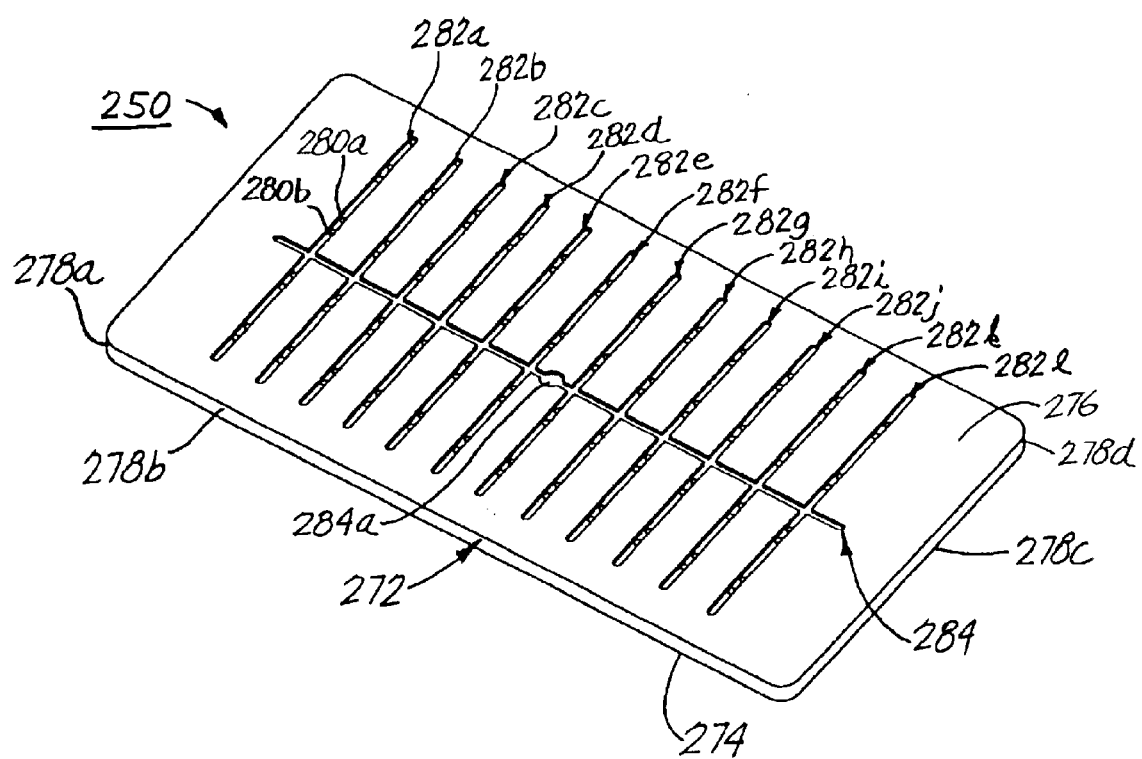
FIG. 16 is a perspective view of a bottom plate member of the vacuum substrate chuck array shown in FIGS. 14 and 15.

A modified version of the vacuum substrate chuck array 200 is illustrated in FIGS. 14–16. More particularly, a vacuum substrate chuck array 250 has a construction and operation basically identical to those of the vacuum substrate chuck array 200 shown in FIGS. 10–13, except as described hereinbelow. The vacuum substrate chuck array 250 is provided with a top plate member 252 and a bottom plate member 272. The top plate member 252 includes an upper exterior wall surface 254, a bottom interior wall surface 256 and side wall surfaces 258a–258d. Openings 260 are formed in the top plate member 252 by a wire electrical discharge machining (EDM) process or by other conventional processes. More particularly, the openings 260 extend completely through the top plate member 252 from the bottom interior wall surface 256 to the upper exterior wall surface 254. Moreover, each of the openings 260 includes a series of wells 262 arranged in a lateral direction, as well as slots 266a, 266b extending outwardly from a corresponding one of the openings 260 for receiving the pincer 62a or the pincer 62b of the tweezer 60 (see FIG. 14A) when the substrate members 20 are loaded onto the vacuum substrate chuck array 250 with the use of the tweezer 60. Secondary openings 268a–268d are formed at corners of each of the wells 262 for receiving the corner edges 28a–28d of a corresponding one of the substrate members 20. Each of the openings 260 also includes an array of channels 264, each of which extends between an adjacent pair of the wells 262, so as to accommodate the pincers 62a, 62b of the tweezer 60 (see FIG. 14A).

Now referring to FIGS. 15 and 16, the bottom plate member 272 includes a substantially planar upper interior wall surface 274, a bottom exterior wall surface 276 and side wall surfaces 278a–278d. The upper interior wall surface 274 includes a plurality of vacuum openings 280a, 280b arranged in the lateral direction, while the bottom exterior wall surface 276 includes a plurality of U-shaped channels 282a–282l and a U-shaped channel 284. The channel 284 is provided with an enlarged section 284a. Each of the channels 282a–282l intersects the channel 284 such that they are in communication with same. Further, each of the channels 282a–282l is in communication with a corresponding set of the vacuum openings 280a–280b (see FIGS. 14B and 16).

With reference to FIG. 14, the top plate member 252 is spot-welded to the bottom plate member 272 at multiple points so as to attach the top and bottom plate members 252, 272 to each other. Alternatively, the top plate member 252 can be attached to the bottom plate member 272 by other conventional attaching mechanisms (e.g., bolts). The top plate member 252 is attached to the bottom plate member 272 such that each pair of the vacuum openings 280a, 280b is aligned with a corresponding one of the wells 262 of the top plate member 252 (see FIGS. 14–14B). In this manner, the substrate members 20 loaded onto the vacuum substrate chuck array 250 can be securely retained in the wells 262 by application of suction through the channels 284, 282a–282l and the vacuum openings 280a, 280b. Because the openings 260 and hence the wells 262 extend completely through the top plate member 252 and their bottom open ends are closed off by the upper interior wall surface 274 of the bottom plate member 272, each of the wells 262 is provided with a bottom having a substantially right-angled lower edge or corner 286, thereby allowing the substrate members 20 to be properly received in the wells 262 (i.e., the substrate members 20 are engageable or in contact with the upper interior wall surface 274 of the bottom plate member 272) such that suction can be applied more effectively and/or efficiently to the substrate members 20 through the vacuum openings 280a, 280b.

With reference to FIGS. 10–16, it should be noted that while both of the vacuum substrate chuck arrays 200, 250 have a wide range of applications, the vacuum substrate chuck array 200 is especially suitable for use in connection with dies having a relatively small thickness. More particularly, because the depth of the wells 246 of the vacuum substrate chuck array 200 is determined or controlled by the height of the raised platforms 230, the vacuum substrate chuck array 200 can be used in connection with such dies without reducing the thickness of the top plate member 202 and hence without compromising the stability and/or rigidity of the top plate member 202. The die bonder apparatus is also provided with multiple or additional vacuum substrate chuck arrays 200 and/or vacuum substrate chuck arrays 250.

Figure 18:
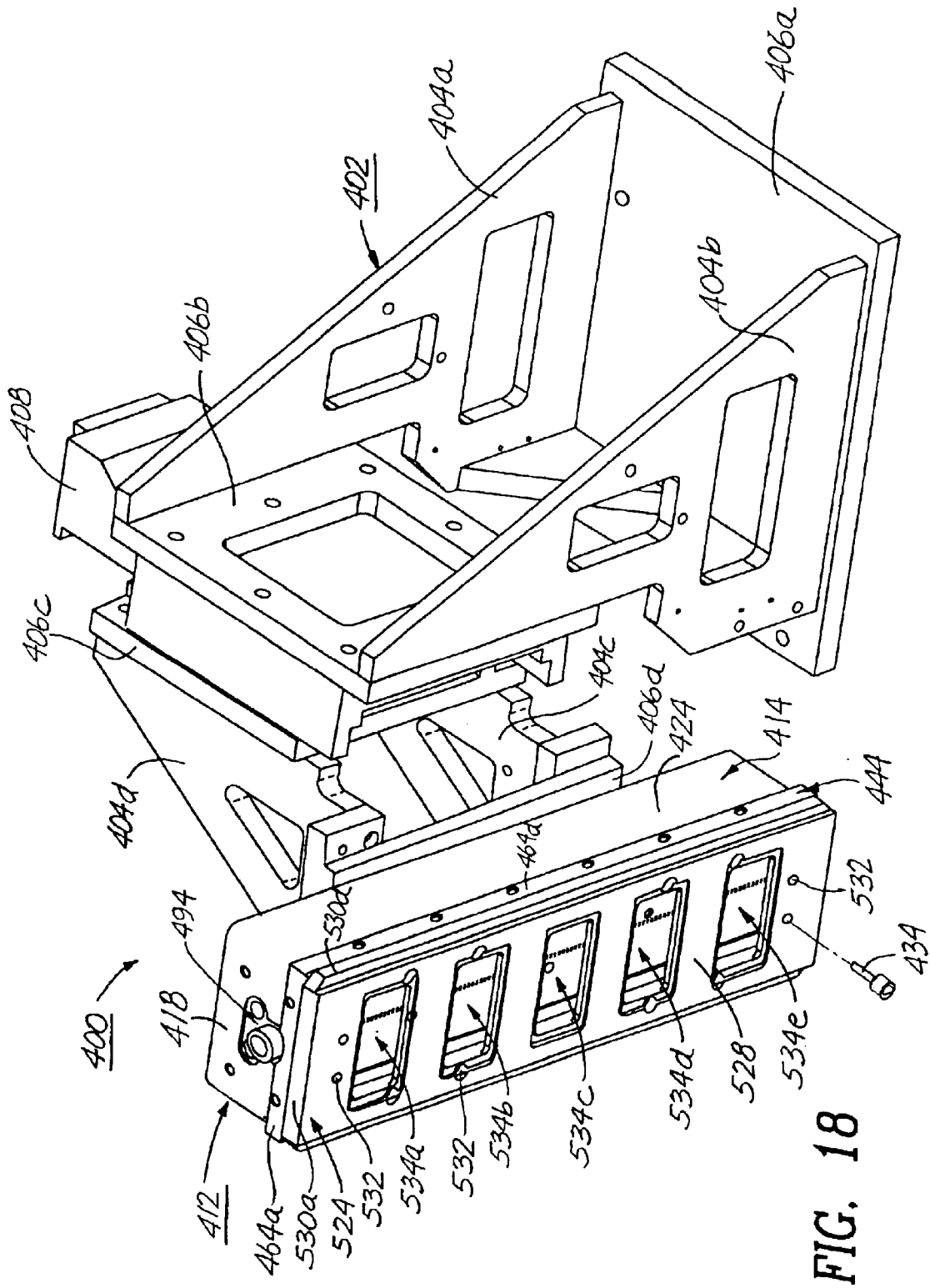
FIG. 18 is a perspective view, looking from below, of an oven frame support sub-assembly and an oven housing sub-assembly of the reflow oven assembly shown in FIG. 17.
Figure 19:
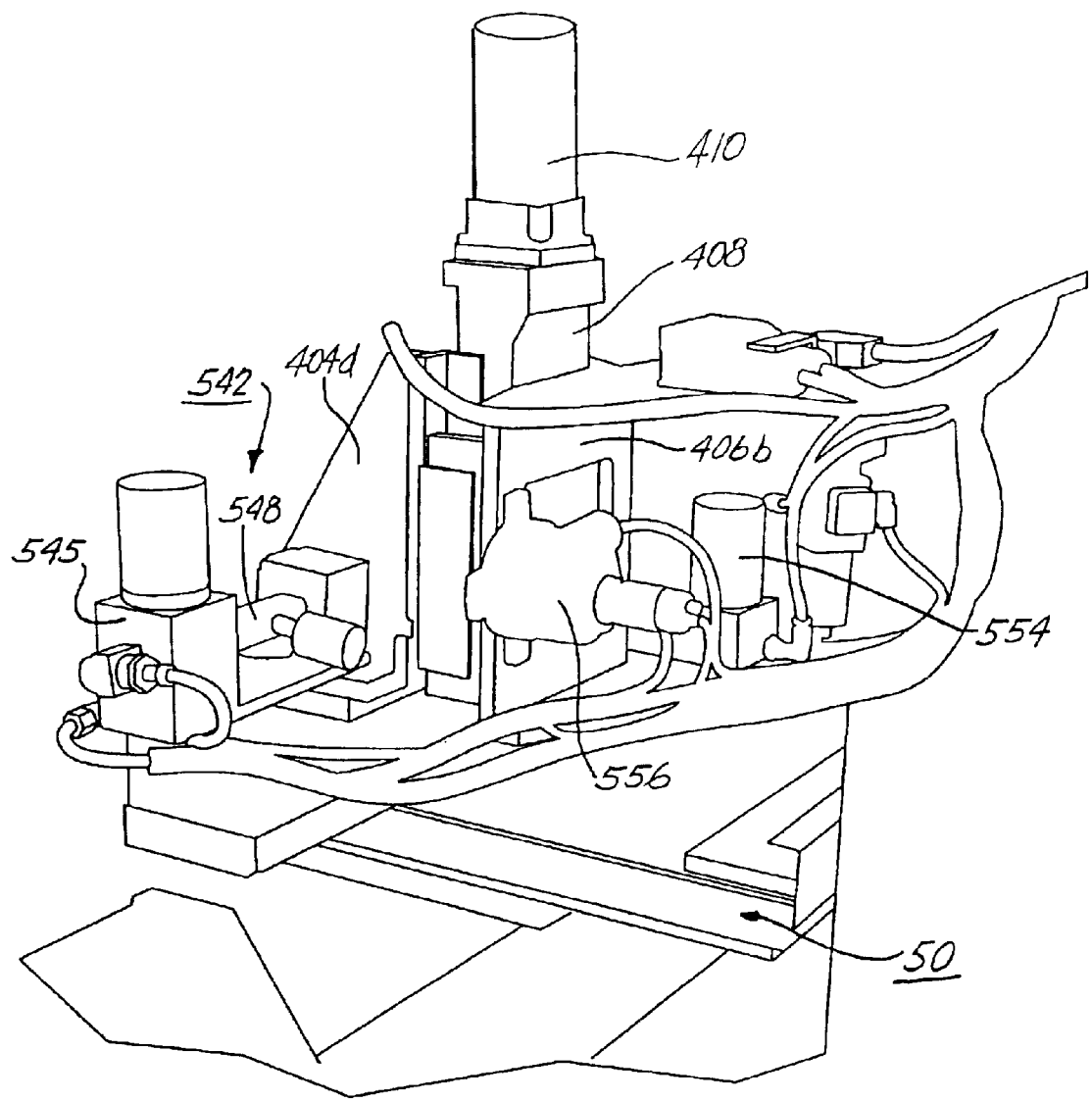
FIG. 19 is a perspective lateral view of the reflow oven assembly shown in FIGS. 17 and 18.

Referring primarily to FIGS. 17, 18, 19 and 21, the reflow oven assembly 400, which is positioned at a heating station on the bonding apparatus 10, includes an oven frame support sub-assembly 402, an oven housing sub-assembly 412 and a gas heater sub-assembly 542. With reference to FIGS. 17 and 18, the oven frame support sub-assembly 402 includes a plurality of support brackets 404a–404d, a plurality of mounting plates 406a–406d, a shaft housing member 408 and a support motor 410 (see FIG. 19). More particularly, the support brackets 404a, 404b are attached to the mounting plates 406a, 406b, while the support brackets 404c, 404d are attached to the mounting plates 406c, 406d. The mounting plate 406a is attached to the upper granite bridge 48 of the machine base assembly 40 for mounting the reflow oven assembly 400 to same. The support plate 406c is coupled to the support motor 410, which is mounted to the shaft housing member 408, for selectively moving the oven housing sub-assembly 412 in the Z-axis direction in response to the activation of the support motor 410.

Figure 20A:
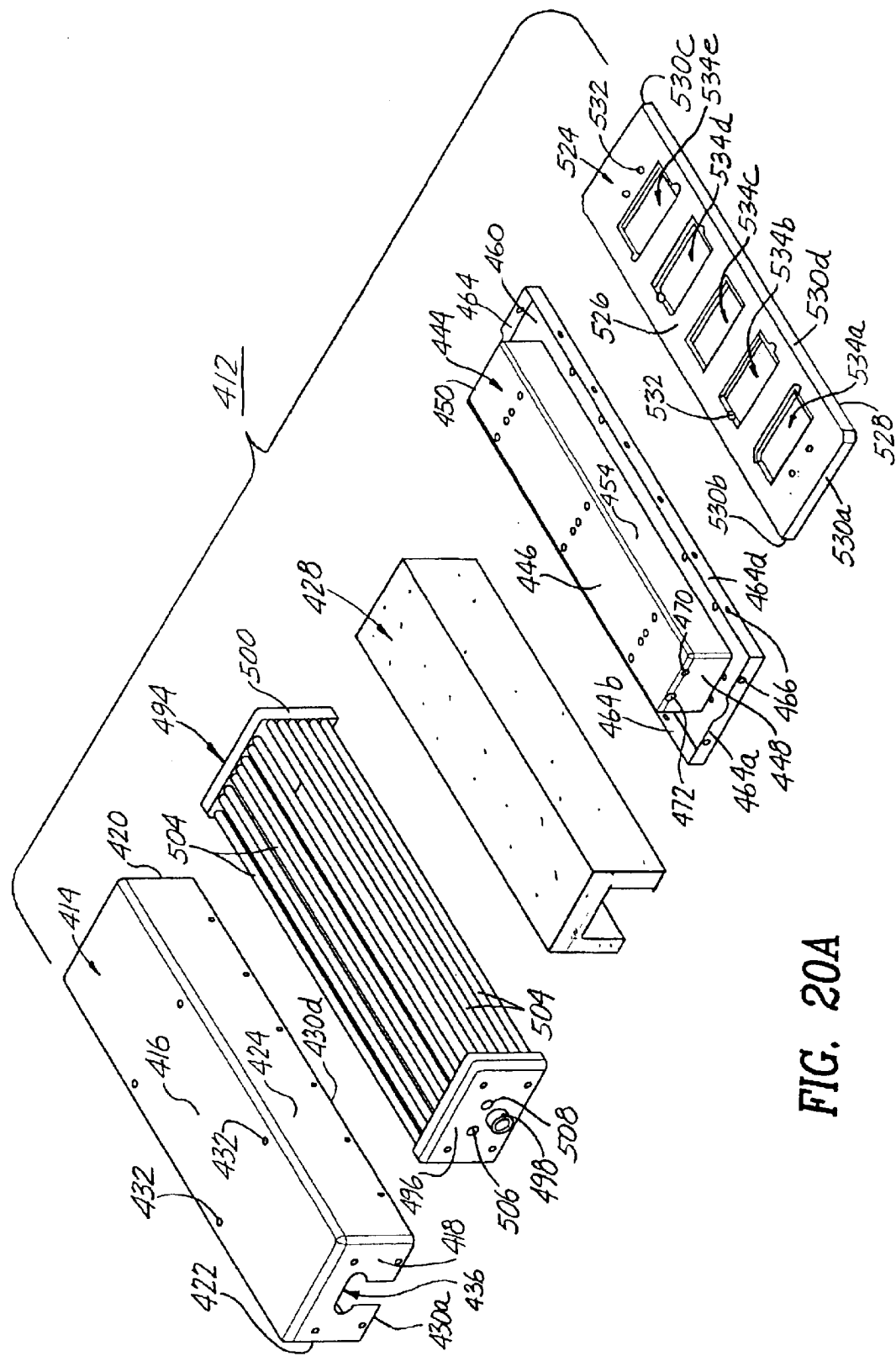
FIG. 20A is an exploded perspective view, looking from above, of the oven housing sub-assembly shown in FIG. 18.
Figure 20B:
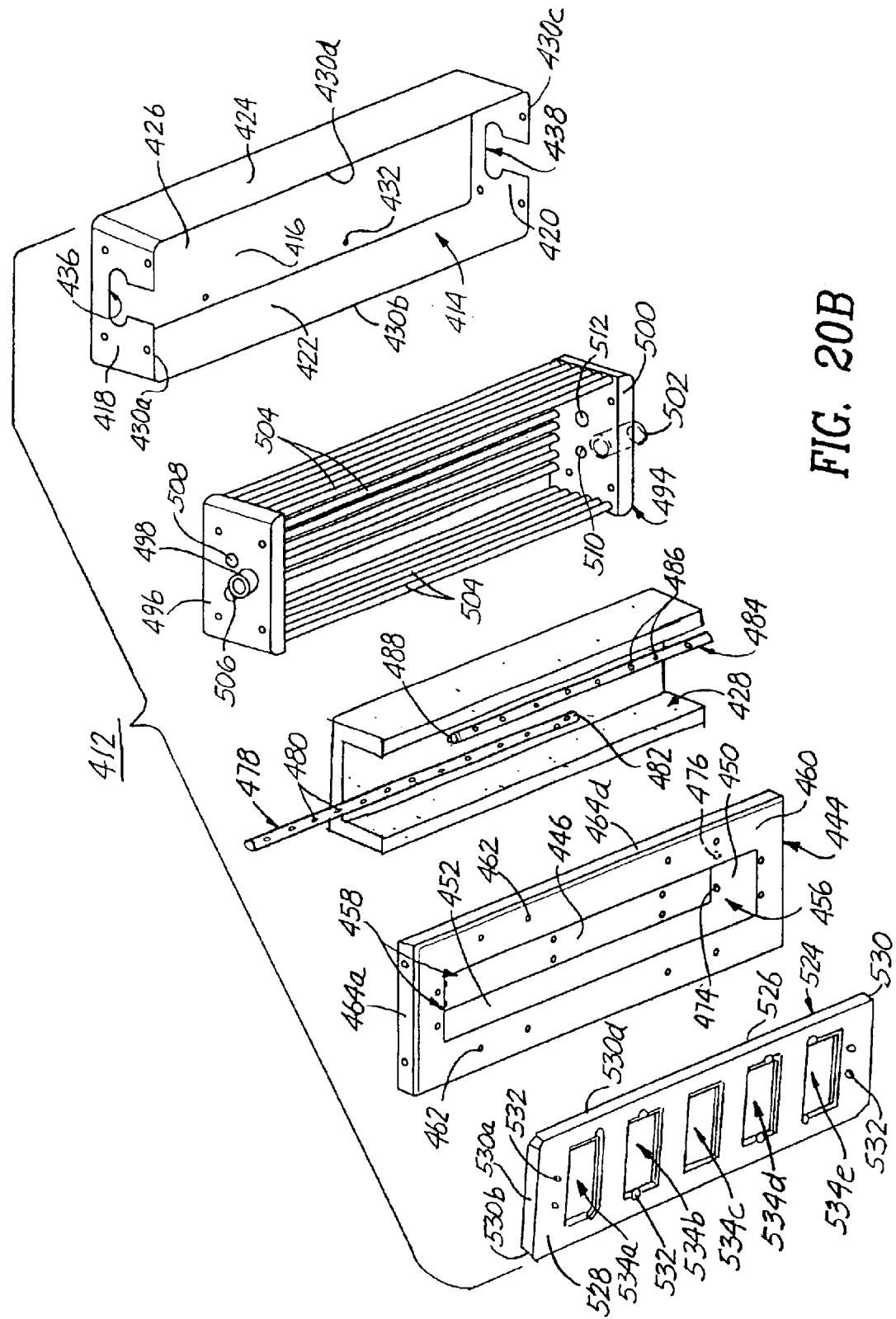
FIG. 20B is an exploded perspective view, looking from below, of the oven housing sub-assembly shown in FIG. 18.

Now referring to FIGS. 18, 20A and 20B, the oven housing sub-assembly 412 includes an outer oven housing shell 414, an interior oven housing shell 444, an interior water-jacket member 494 and an insulated base member 524. The outer oven housing shell 414 includes a top wall 416, a front wall 418, a rear wall 420, side walls 422, 424 which cooperate to form an interior chamber 426 for receiving an insulation layer 428 therein (see FIGS. 20A and 21). The outer oven housing shell 414 includes perimeter edges 430a, 430b, 430c, 430d. The top wall 416 of the outer oven housing shell 414 is provided with a plurality of mounting openings 432 for attaching the oven housing sub-assembly 412 to the mounting plate 406d via mounting screws for conjoint movement with same. The front wall 418 includes a front T-shaped opening 436, while the rear wall 420 includes a rear T-shaped opening 438.

As shown in FIGS. 20A and 20B, the interior oven housing shell 444 includes a top wall 446, a front wall 448, a rear wall 450 and side walls 452, 454 which cooperate to form an interior oven compartment 456 having an open bottom end 458. An interior perimeter base section 460, which is formed integrally with the front, rear and side walls 448, 450, 452, 454 and which has a plurality of mounting openings 462, extends from the open bottom end 458. The base section 460 includes perimeter side walls 464a–464d, each of which has a plurality of mounting openings 466 therein. An interior baffle wall 468 (see FIG. 21) depends from the top wall 446 for purposes to be discussed hereinafter. Tube openings 470, 472 are formed in the front wall 448, while tube openings 474 and 476 are formed in the rear wall 450. A metal tube 478, which has a plurality of perforations 480 along the length thereof and a capped (i.e., closed) end 482, is mounted in the interior oven compartment 456 through the tube opening 472 of the front wall 448 for introducing nitrogen gas ($N_2$) into the interior oven compartment 456 during the reflow process 600. Likewise, a metal tube 484, which has a plurality of perforations 486 along the length thereof and a capped (i.e., closed) end 488, is mounted in the interior oven compartment 456 through the tube opening 476 of the rear wall 450 for applying vacuum to the interior oven compartment 456 using a vacuum pump 490 (see FIG. 25).

Figure 21:
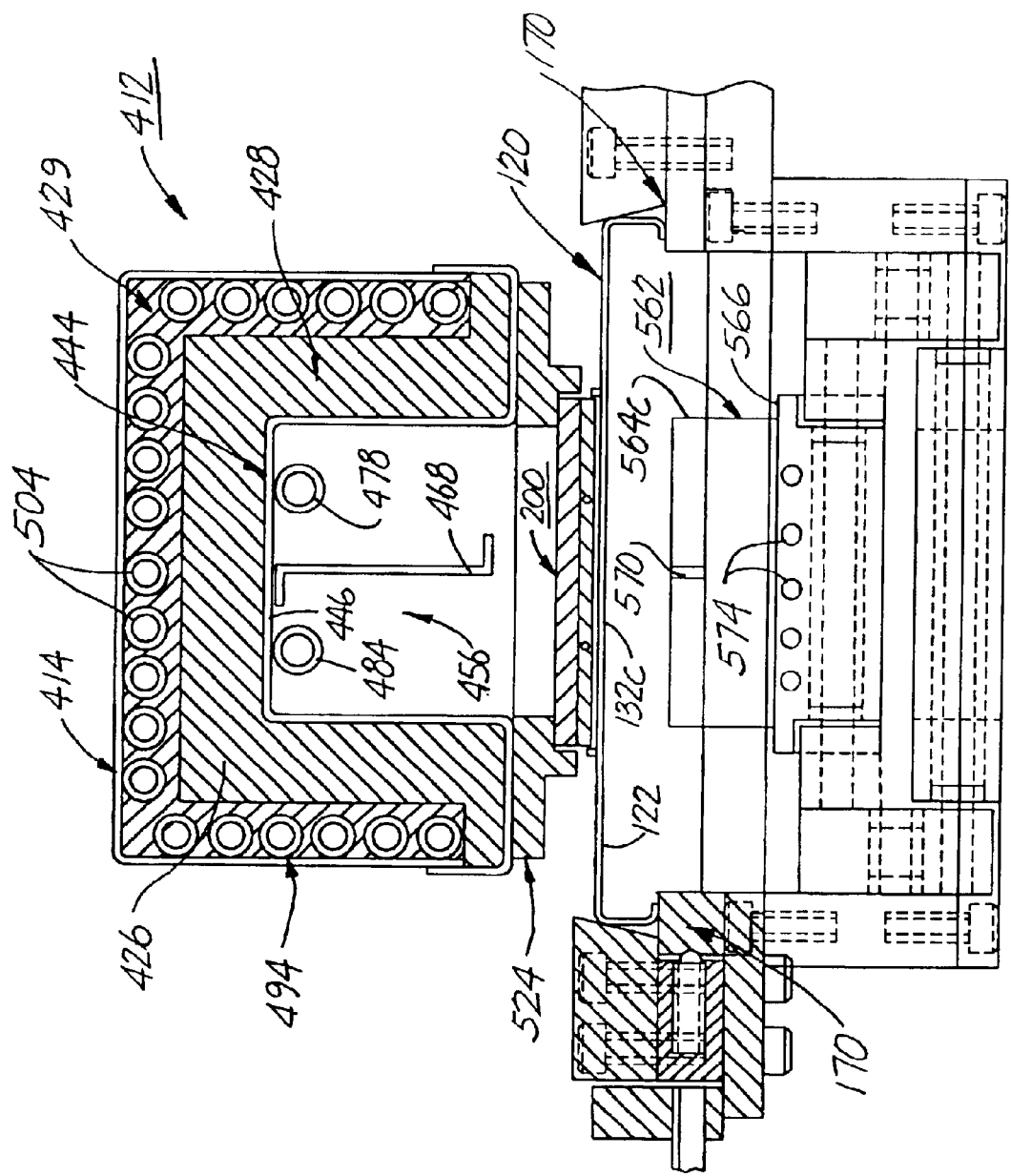
FIG. 21 is a schematic view of the reflow oven assembly shown in FIG. 17.
Figure 22:
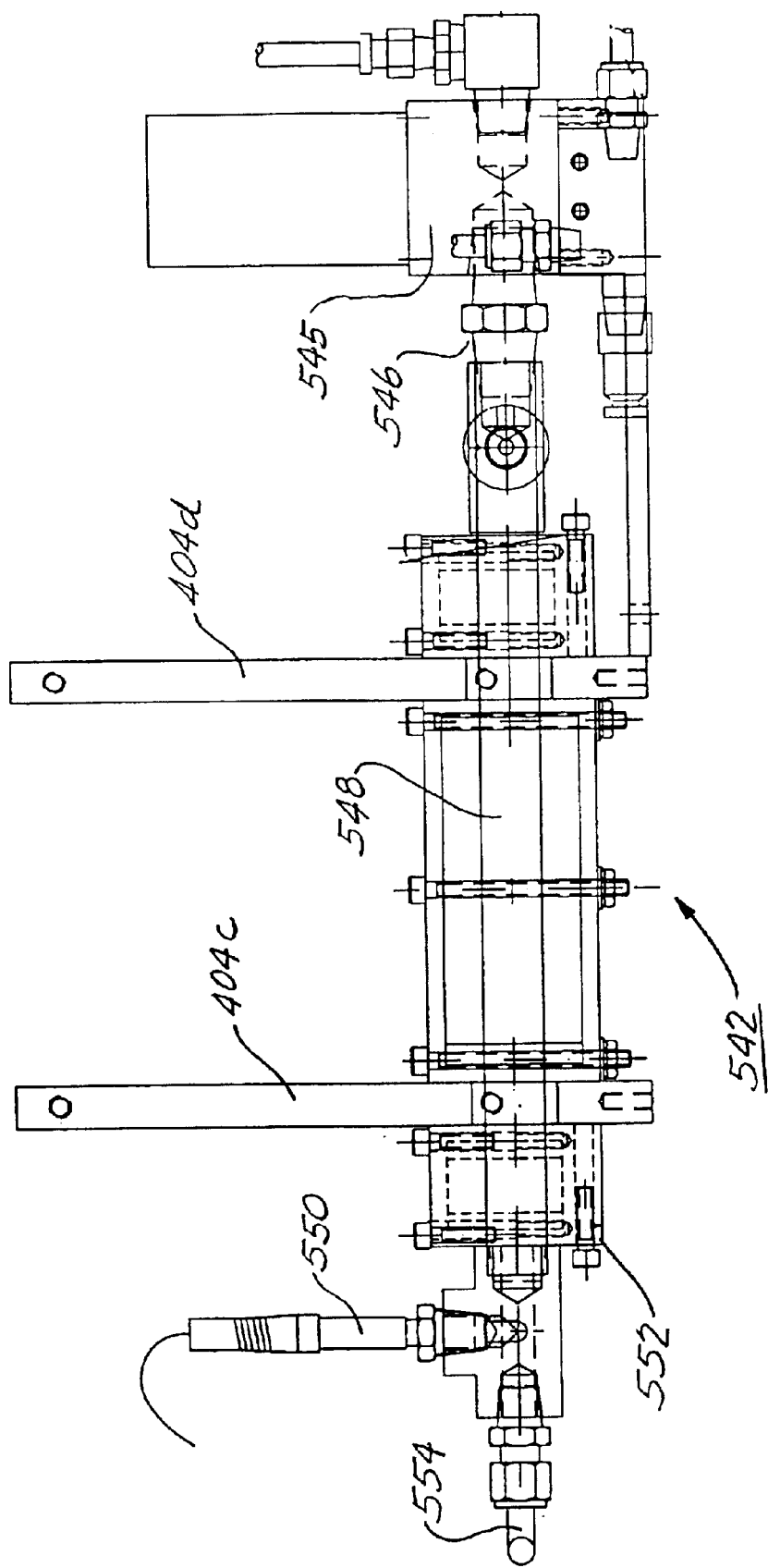
FIG. 22 is a side view of a gas heater sub-assembly of the reflow oven assembly shown in FIG. 17.

Referring to FIGS. 20A, 20B and 21, the interior water-jacket member 494, which is mounted in the interior chamber 426 of the outer oven housing shell 414, includes a hollow wall section 496 at one end thereof. The hollow wall section 496 includes an water inlet fitting 498 integrally formed therewith. A hollow wall section 500 is positioned at an opposite end of the interior water-jacket member 494 and has a water outlet fitting 502, which is integrally formed with the hollow wall section 500. The water inlet fitting 498 of the hollow wall section 496 is received in the T-shaped opening 436 of the front wall 418 of the outer oven housing shell 414, while the outlet water fitting 502 is received in the T-shaped opening 438 of the rear wall 420 of the outer oven housing shell 414 (see FIGS. 17 and 18). Tubes 504 extend between the hollow wall sections 496, 500 for permitting water flow from the water inlet fitting 498 to the water outlet fitting 502. The tubes 504 are integrally formed with the hollow wall sections 496, 500. Alternatively, the tubes 504 can be discrete members attached to the hollow wall section 496, 500 in a liquid-tight manner. The hollow wall section 496 includes a pair of openings 506 and 508, while the hollow wall section 500 includes a pair of openings 510 and 512. The openings 506, 512 of the hollow wall sections 496, 500, respectively, are sized and shaped so as to receive the tubes 478, 484, respectively, therethrough. An inlet thermocouple (T/C) probe 514 (see FIG. 25) is mounted in the water inlet fitting 498 for measuring the temperature of water entering the interior water-jacket member 494, while an outlet thermocouple (T/C) probe 516 is mounted in the water outlet fitting 502 for measuring the temperature of water discharging from the interior water-jacket member 494. The interior water-jacket member 494 is also provided with an insulation 429 (see FIG. 21).

With reference to FIGS. 20A and 20B, the insulated base member 524, which is substantially rectangular in shape and is made from a suitable material, such as silicone, styrene and other polymer materials, includes a top wall surface 526, a bottom wall surface 528, side wall edges 530a–530d and a plurality of mounting openings 532 adjacent to the side wall edges 530a–530d. The insulated base member 524 also includes a plurality of substrate chuck array openings 534a–534e, each of which is sized and shaped so as to receive the vacuum substrate chuck arrays 200 or the vacuum substrate chuck arrays 250. More particularly, the openings 534a–534e form part of the interior oven compartment 456. Mounting screws 434 (see FIG. 18) extend through the mounting openings 532 of the insulated base member 524 and the mounting openings 462 of the base section 460 for removably attaching the insulated base member 524 to the interior oven housing shell 444 (see FIG. 18).

Now referring to FIGS. 17, 19, 22 and 25, the heater sub-assembly 542 includes a nitrogen gas ($N_2$) supply 544, an inlet regulator 545, a valve 546, a heater 548, an outlet thermocouple (T/C) probe 550 for measuring the temperature of heated nitrogen, a gas and air outlet regulator and valve member 552 and a gas line 554. The heater sub-assembly 542 also includes a gas pump 556 for supplying nitrogen ($N_2$) gas to the inlet regulator 545. As will be discussed in greater detail hereinafter, the heater sub-assembly 542 is adapted for heating a supply of nitrogen gas to a predetermined temperature (e.g., up to about 400° C.) so as to inject heated nitrogen gas into the interior oven compartment 456 and to thereby remove oxygen substantially completely therefrom for inhibiting oxidation of the solders 610 (see FIG. 26) during the performance of the fluxless reflow process 600. The injected nitrogen gas is also used to evenly exert pressure on the die/substrate assemblies 30 carried on the substrate chuck arrays 200 or 250.

Figure 23:
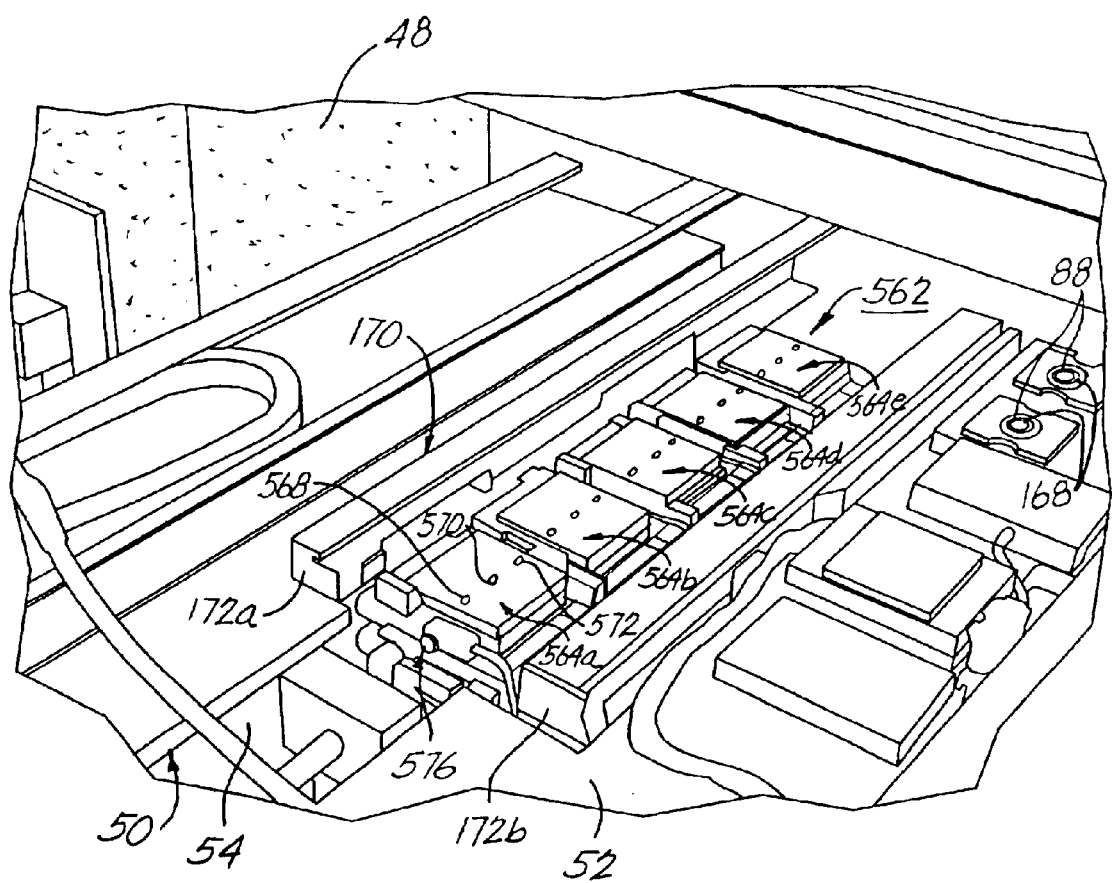
FIG. 23 is a perspective view of a lower chuck sub-assembly of the die bonding apparatus shown in FIGS. 1–3.
Figure 24:
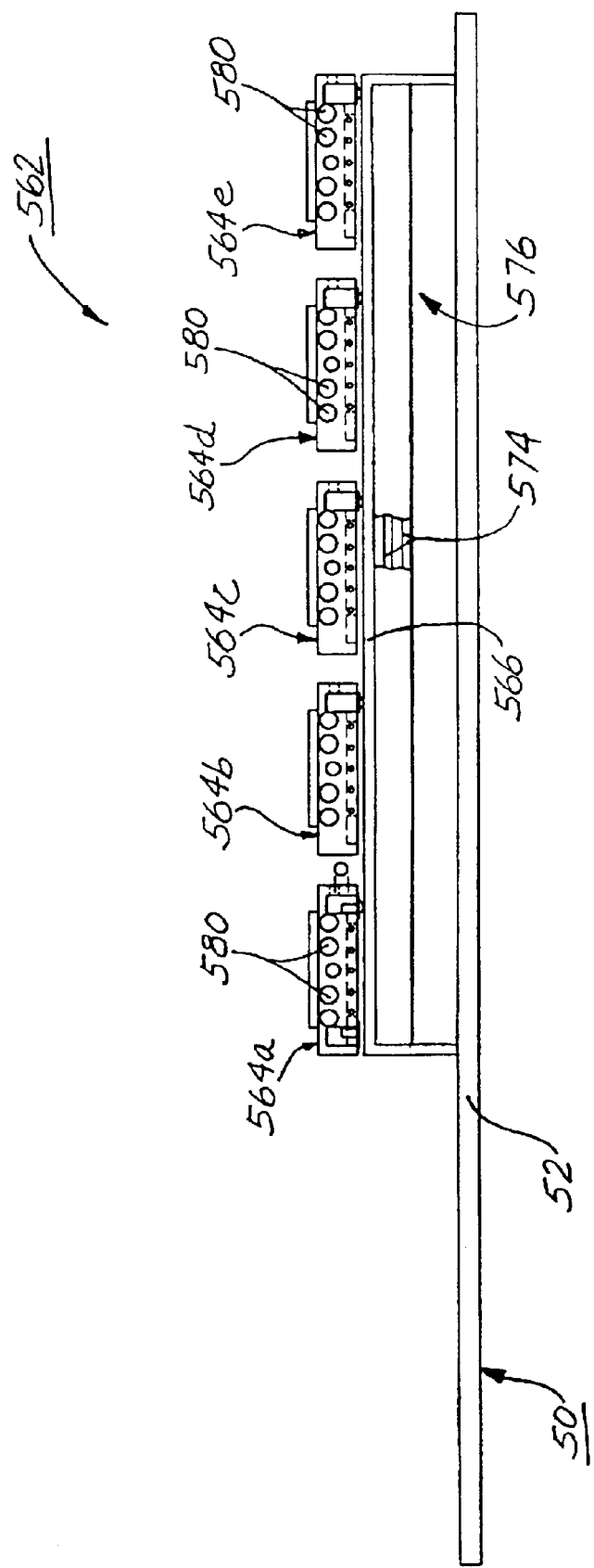
FIG. 24 is a side view of the lower chuck sub-assembly shown in FIG. 23.

With reference to FIGS. 21, 23 and 24, the die bonder apparatus 10 is also provided with a lower chuck sub-assembly 562. More particularly, the lower chuck sub-assembly 562 includes a base section 566 and a plurality of platforms 564a–564e, which are mounted on the base section 566. Each of the platforms 564a–564e is provided with an opening 570 sized and shaped so as to communicate with the enlarged section 284a of the channel 284 of a corresponding vacuum substrate chuck array 250 placed thereon. The openings 570 can be modified so as to accommodate the vacuum opening configuration (i.e., the vacuum openings 244a–244d) of the vacuum substrate chuck arrays 200. An opening 568 and an opening 572 are provided in each of the platforms 564a–564e for purposes to be discussed hereinafter. The lower chuck sub-assembly 562 also includes a water-jacket element 574, which is mounted within the base section 566. A moving mechanism 576 is mounted on the upper X-stage 52 of the X-Y stage assembly 50 for supporting the base section 566 thereon. The moving mechanism 576 is also adapted for selectively moving the base section 566 and hence the platforms 564a–564e in the Z-axis direction. Each of the platforms 564a–564e includes heating elements 580 therein for heating the substrates 20 carried by the substrate chuck arrays 200 or 250.

With reference to FIG. 26, the eutectic solder 610 is pre-deposited on each of the substrate members 20 prior to the mounting of the dies 12 thereto. Typically, eutectic solders are made from alloys having a reflow temperature lower than that of its major constituent (e.g., gold). The eutectic solders 610, in accordance with the present invention, are preferably made from an alloy having gold and tin. The eutectic solders 610 made from an alloy of about 80% gold and about 20% tin are especially suitable for use in connection with the present invention. More particularly, the 80/20 gold tin alloy is preferred, because its melting point is approximately 283° C., which is substantially lower than the melting temperature of pure gold (i.e., above 800° C.), thereby permitting the performance of the reflow process 600 with a lower reflow temperature. Alternatively, other ratios between gold and tin can be used in forming the eutectic solders 610. Moreover, the eutectic solders 610 can be made from other suitable alloys or materials (e.g., lead tin, indium tin, silver tin and gold bismuth).

The operation of the die bonder apparatus 10 will be described in detail hereinbelow. While the die bonder apparatus 10 can be used in connection with both types of the vacuum substrate chuck arrays 200, 250, to facilitate consideration and discussion, the operation of the die bonder apparatus 10 will be discussed below in connection with the vacuum substrate chuck arrays 250. Now referring to FIG. 6, the waffle/gel packs 14 containing the dies 12 are loaded onto the waffle/gel pack holders 88 and held in place by application of suction through the vacuum openings 168. The substrate members 20 are also manually placed in the openings 260 of the substrate chuck arrays 250 by using the tweezer 60 or by using other placement mechanisms (e.g., vacuum-type pick-up devices). The vacuum substrate chuck arrays 250 are then put into the array openings 132a–132e of the carrier members 120. Each of the substrate chuck arrays 250 is individually centered on a corresponding one of the array openings 132a–132e of the carrier members 120 by a corresponding set of the retainer posts 134a–134h of the carrier members 120 (see FIG. 8A). The carrier members 120 are then inserted into the magazine holders 82A, 82B. More particularly, the extension guides 130a, 130b of each of the carrier members 120 is received in a corresponding one of the support ledges 116a–116i of the magazine holders 82A and 82B so as to removably support the carrier members 120 in a corresponding one of the magazine holders 82A, 82B (see FIG. 8A). The magazine holders 82A, 82B are then placed on the magazine loader 84 and are held in place by the clamping members 144a, 144b, respectively, such that the magazine holders 82A, 82B are positioned adjacent to the X-Y stage assembly 50 and are accessible by same (see FIG. 8).

With the magazine holders 82A, 82B properly loaded on the magazine loader 84, the X-Y stage assembly 50 is moved adjacent to the magazine loader 84. The magazine elevator 140 is actuated so as to adjust the magazine loader 84 in the Z-axis direction such that one of the carrier members 120 can be gripped by the holders 164a and 164b of the gripper sub-assembly 86. The gripped carrier member 120 is then pulled by the gripper sub-assembly 86 from a corresponding one of the magazine holders 82A, 82B and then loaded onto the carrier guide member 170 by moving the X-Y stage assembly 50. The mounting tabs 174 of the carrier guide member 170 are received in the mounting openings 132 of the longitudinal extension guides 130a and 130b of the carrier member 120 (see FIGS. 8 and 8A) so as to secure the carrier member 120 to the carrier guide member 170. The carrier member 120 is hence located adjacent to or above the lower chuck sub-assembly 562. The moving mechanism 576 of the lower chuck sub-assembly 562 is then activated so as to cause the platforms 564a–564e to rise in the Z-axis direction. As a result, the platforms 564a–576e engage the bottom exterior wall surfaces 276 of the vacuum substrate chuck arrays 250 mounted on the carrier member 120, thereby lifting the substrate chuck arrays 250 out of the array openings 132a–132e of the carrier member 120 (see FIGS. 7, 21, 23 and 24). More particularly, the vacuum openings 570 of the platforms 564a–564e is aligned with the enlarged sections 284a of the U-shaped channels 284 of the substrate chuck arrays 250 (see FIGS. 16 and 23). As the platforms 564a–564e move upward and come in contact with the substrate chuck arrays 250, suction is applied to the substrate chuck arrays 250 through the vacuum openings 570 (see FIG. 23) of the platforms 564a–564e. As a result, the suction applied to the substrate chuck arrays 250 is then distributed to each of the substrate members 20 through the enlarged section 284a, the U-shaped channels 284, 282a–282l and the vacuum openings 280a and 280b (see FIGS. 14A–16). In this manner, the substrate members 20 can be gripped by suction and hence securely retained within the substrate chuck arrays 250. The suction applied to the substrate members 20 is not released until the entire mounting process, including the entire fluxless reflow process 600, is completed using the die bonder apparatus 10. The heating elements 580 of the lower chuck sub-assembly 562 are also activated so as to heat the substrate members 20 to a predetermined background temperature. The substrate members 20 are preferably maintained at this background temperature throughout the entire tacking process discussed hereinafter.

The upper chuck sub-assembly 306 of the bonding head assembly 300 is provided with an appropriate die pick-up tool (not shown) from a tool nest (not shown) for use in picking up the dies 12 from the waffle/gel packs 14, which are held in the holders 88 on the X-Y stage assembly 50 (see FIGS. 4–6). The upper chuck sub-assembly 306 is heated in a conventional manner so as to heat an associated die held thereby to a predetermined background temperature. After one of the dies 12 is picked up by the bonding head assembly 300, the X-Y stage assembly 50 is activated so as to position a preselected one of the substrate members 20 retained within the substrate chuck arrays 250 below the upper chuck sub-assembly 306 and hence the picked-up die 12. A conventional alignment process is performed using the optical probe 364 of the optical system assembly 340. After the die 12 is properly aligned with the associated substrate member 20, the upper chuck sub-assembly 306 is lowered so as to tack the die 12 to the substrate member 20. In this regard, the upper chuck sub-assembly 306 preferably applies a compression force ranging from about 10 g to about 100 Kg so as to achieve proper tacking of the die 12 to the substrate member 20.

It is important to properly tack the dies 12 to the substrate members 20. More particularly, if proper tacking is not achieved, the solders 610 may not reflow properly, and the dies 12 may be easily detached from the substrate members 20. In order to achieve proper/good tacking, when mounting the die 12 to substrate member 20 deposited with the gold tin solders 610, the substrate member 20 is heated by the lower chuck sub-assembly 562 to a tacking (i.e., background) temperature preferably ranging from about 100° C. to about 300° C. and more preferably of approximately 200° C., while the die 12 is heated by the upper chuck sub-assembly 306 to a tacking (i.e., background) temperature preferably ranging up to about 200° C. and more preferably of about 100° C. These tacking temperatures, which can vary or be changed to different temperatures depending upon application requirements and/or needs (e.g., depending upon the type of solders used), are below the reflow temperature of the solders 610, which tends to oxidize rapidly when heated above 220° C. Oxidation of the solder 610 may cause the formation of a barrier between metalized layers of the die 12 and the solder 610 on the substrate member 20 and may inhibit a proper reflow of the solders 610. The die 12 is then pressed onto the solder 610 deposited on the substrate member 20 with the force mentioned above.

The alignment and tacking processes discussed above are repeated by the die bonder apparatus 10 until all of the substrate members 20 carried by the substrate chuck arrays 250 are tacked with the dies 12. After the completion of the alignment and tacking processes, the mass fluxless reflow process 600 is performed. More particularly, with the substrates 20 properly tacked with the dies 12, the X-Y stage assembly 50 moves in the X-axis and/or Y-axis directions such that the lower chuck sub-assembly 562 and hence the vacuum chuck arrays 250 are directly below the reflow-oven assembly 400. The support motor 410 then causes the housing sub-assembly 412 to move downwardly in the Z-axis direction such that each of the substrate chuck array openings 534a–534d of the housing sub-assembly 412 receives a corresponding one of the substrate chuck arrays 250, thereby positioning the substrates 20 and the dies 12 placed thereon in the interior oven compartment 456. More particularly, the insulated base member 424 engages the substrate chuck arrays 250 in a substantially air-tight manner. The vacuum pump 490 is then activated so as to withdraw air from the interior oven compartment 456 through the tube 484. Heated nitrogen gas ($N_2$) or inert gas is then introduced into the interior oven compartment 456. More particularly, the nitrogen gas is supplied from the gas supply 544 to the heater 548 through the regulator 545 and the valve 546 (see FIGS. 21 and 25). The nitrogen gas is then heated to a predetermined temperature preferably ranging from 200° C. to about 400° C. and more preferably at about 350° C. The heated nitrogen gas is then supplied to the oven compartment 456 through the tube 478 at a predetermined rate preferably ranging from about 1 cfm to about 30 cfm so as to maintain the pressure within the interior oven compartment 456 preferably from atmospheric pressure to about 30 psi. Alternatively, other gas flow rates and compartment pressures can be used depending upon specific operational requirements and/or needs. Because of the baffle wall 468 mounted in the interior oven compartment 456, the heated nitrogen gas is evenly circulated in the compartment 456 (i.e., the baffle wall 468 prevents air turbulence within the interior oven compartment 456). The temperature of the platforms 564a–564e of the lower chuck sub-assembly 562 is raised to a reflow temperature preferably ranging from about 200° C. to about 400° C. and more preferably of about 330° C. The reflow temperature is maintained for a predetermined time period in conjunction with the heated nitrogen gas ($N_2$) until the solders 610 are properly reflowed. Other reflow temperatures can be selected for the heated nitrogen gas and the platforms 564a–564e, depending upon specific operational requirements and/or needs. Water is also circulated through the interior water-jacket member 494 of the oven housing sub-assembly 412 and the water-jacket element 574 of the lower chuck sub-assembly 562 throughout the reflow process 600 for forming insulation layers (e.g., for preventing the outer oven housing shell 414 from becoming hot and thereby enhancing safety). While performing the reflow process 600, vacuum applied to the interior oven compartment 456 through the tube 484 can be constantly "on" or "off".

During the performance of the reflow process 600 discussed above, the dies 12 are inhibited from moving relative to the substrate members 20 in the following manner. The thickness of the gold tin solders 610 is typically between 3–6 microns. The undersides of the dies 12 are metalized, for instance, with gold and are typically rough, having crevices. When tacked onto the substrates 20, these crevices may function as anchors to hold the dies 12 in the solders 610 during reflow. Since the tacking temperature is much below the reflow temperature, the solders 610 are in their solid form. However, as the solders 610 are heated, they become softer. The softer solders 610 allow the nooks and crannies of the metalized underside of the dies 12 to press into the gold tin solders 610. As a result, the anchors act as conduits for the solders 610 to flow, giving an even and uniform bond, as depicted in FIG. 26.

After the expiration of the predetermined time period for reflow, a cooling cycle begins. More particularly, the heater 548 of the heater subassembly 542 is deactivated. A supply of "cool" or unheated nitrogen gas is introduced into the interior oven compartment 456 by the heater sub-assembly 542 through the tube 478. The heater elements 580 of the platforms 564a–564e are also deactivated, and "cool" or unheated air is supplied to the substrate chuck arrays 250 through the openings 572 and/or the openings 568 of the platforms 564a–564e to aid in cooling. Alternatively, "cool" or unheated nitrogen gas can be supplied to the lower chuck sub-assembly 562.

When the temperature in the oven compartment 456 drops to the background temperature of the lower chuck sub-assembly 562 (e.g., approximately 200° C.), the gas supply is turned off. The support motor 410 is then activated so as to cause the oven housing sub-assembly 412 of the reflow-oven assembly 400 to move upwardly in the Z-axis direction. In this manner, the vacuum substrate chuck array openings 534a–534d on the insulated base member 524 are released from the vacuum substrate chuck arrays 250. The X-Y stage assembly 50 then moves back to the loading/unloading position of the magazine holders 82A and 82B of the magazine loader 84 (see FIG. 8). Suction applied to the vacuum openings 570 of the platforms 564a–564e of the lower chuck sub-assembly 562 is then deactivated, hence terminating suction applied to the substrate members 20. The moving mechanism 576 then lowers the lower chuck sub-assembly 562 in the Z-axis direction, hence loading the vacuum substrate chuck arrays 250 into the array openings 132a–132e of the carrier member 120. The retainer posts 134a–134h center the substrate chuck arrays 250 into the array openings 132a–132e of the carrier member 120. Next, the gripper member 162 moves the carrier member 120 (having the completed die/substrate assemblies 30 within each of the substrate chuck arrays 250) back into the magazine holder 82A or 82B. The magazine holders 82A and 82B are then indexed to the next carrier member 120 via the computer system 740 for a subsequent mounting/bonding cycle.

It should be appreciated that the present invention provides numerous advantages over the prior art discussed above. For instance, because the reflow oven assembly 400 is mounted (i.e., integrated) directly to the die bonder apparatus 10, there is no need to transport, subsequent to the tacking of the dies 12 to the substrates 20, the vacuum substrate chuck arrays 200, 250 from the X-Y substrate stage assembly 50 to an external furnace/oven for a reflow process with the use of a separate transporting mechanism. More particularly, because the dies 12 are tacked and are not therefore solidly attached to the substrates 20 prior to the performance of the reflow process, any movement or vibration can increase the risk of the dies 12 moving relative to the substrate members 20. Since the reflow oven assembly 400 is integrated with the die bonder apparatus 10 and the reflow process 600 is performed entirely within the die bonder apparatus 10, movement and/or vibration can be minimized. Moreover, the substrate members 20 are continuously gripped by the lower chuck sub-assembly 562 via suction applied thereto throughout the tacking and reflow processes. In other words, the suction is not released until the die/substrate assemblies are solidly affixed to one another (i.e., soldered), thereby promoting accurate placement and bonding of the dies 12 to the substrate members 20. Further, because the reflow oven 400 is adapted for batch reflow of a number of dies and substrates in a single operation or step, bonding of the dies 12 to the substrate member 20 can be performed in a significantly reduced time period (e.g., one second per die/substrate assembly based upon 300 assemblies undergoing a batch reflow process), compared with a conventional reflow process. For example, because a reflow step in a conventional process is typically performed for each die, significant time is required for heating and cooling each individual die. In addition, the vacuum substrate chuck arrays 200, 250 are used to hold the substrate members 20 throughout the entire mounting/bonding process, inhibiting movement of the substrate members 20 and hence promoting accurate mounting of the dies 12 to the substrate members 20.

The reflow process 600 of the present invention also provides numerous advantages over the prior art discussed above. For instance, because ambient air is removed from the interior oven compartment 456 and heated nitrogen is introduced into the interior oven compartment 456, reflow of the solders 610 is performed under a substantially oxygen-free environment, thereby inhibiting oxidation of the solders 610. Moreover, because the dies 12 are not held by any holding members during reflow, but are held by positive pressure exerted by the nitrogen gas introduced into the interior oven compartment 456, even pressure is applied to the dies 12. As a result, the dies 12 tend to reach an equilibrium in the Z-axis direction. Moreover, compared to a conventional reflow method, in which dies are typically held by a holder during reflow, solder loss is minimized with the use of the reflow process 600 of the present invention due to the absence of such a holder, which may cause over-pressing of the dies to the substrates. As a result, the risk of extraneous solder distributing onto die surfaces is minimized. Further, with the reflow process 600 of the present invention, more solder is left under the dies 12, thereby increasing their shear strength.

It should be noted that the present invention can have numerous modifications and variations. For instance, while the present invention is especially suitable for use in connection with optoelectronic devices, it can be used in conjunction with other types of dies and/or substrates. In addition, components of the die bonder apparatus 10 (e.g., the reflow process 600, the reflow oven assembly 400 and the vacuum substrate chuck arrays 200, 250) can be used independently and separately from one another or in combination with each other.

The vacuum substrate chuck arrays 200, 250 can also have numerous modifications and variations. For instance, suction can be applied to the vacuum openings 236a, 236b and the vacuum openings 280a, 280b of the vacuum substrate chuck arrays 200, 250, respectively, through mechanisms other than the channels 240a–240i, 242a, 242b or the channels 282a–282l and 284. In other words, any configuration/construction of suction applying channels can be used in the vacuum substrate chuck arrays 200, 250. Moreover, each of the openings 210, 260 of the vacuum substrate chuck arrays 200, 250, respectively, can have a different number of vacuum openings (e.g., one vacuum opening for each opening 210 or 260). The top and bottom plate members 202, 222 and the top and bottom plate members 252, 272 of the vacuum substrate chuck arrays 200, 250 can be attached to one another by any conventional mounting mechanisms (e.g., press-fit, welded, etc.). Moreover, the vacuum substrate chuck arrays 200, 250 can be provided with different sizes and shapes.

The reflow process 600 can also have numerous modification and variations. For instance, the reflow process 600 can be performed using other inert (i.e., oxygen-repelling) gases or forming gases (e.g., a mixture of nitrogen and hydrogen). In addition, during the performance of the reflow process 600, vacuum can be continuously and/or constantly applied to the interior oven compartment 456 through the tube 484. Moreover, other eutectic solders can be used as the solders 610.

It will be understood that the embodiment(s) described herein is merely exemplary and that a person skilled in the art may make many variations and modifications without departing from the spirit and scope of the invention. All such variations and modifications, including those discussed above, are intended to be included within the scope of the invention as defined by the appended claims.

We claim:

1. A method for mounting a semiconductor component to a substrate, comprising the steps of placing a substrate on a platform; positioning a semiconductor component on the substrate such that a solder is interposed between the substrate and the semiconductor component; forming a substantially enclosed compartment around the semiconductor component and substrate; supplying a substantially oxygen-free, heated gas into the compartment; heating the platform to a first temperature so as to cause the solder positioned between the substrate and the semiconductor component to reflow; and cooling the reflowed solder so as to attach the semiconductor component to the substrate, wherein said positioning step includes the steps of heating the solder to a second temperature, which is lower than the reflow temperature of the solder, so as to soften the solder; and pressing the semiconductor component onto the softened solder positioned on the substrate, whereby the semiconductor component can be temporarily secured to the substrate so as to facilitate the soldering of the semiconductor component to the substrate.

2. The method of claim 1, wherein said step of heating the solder to the second temperature so as to soften the solder is performed by heating the platform.

3. The method of claim 1, wherein said step of heating the platform to the first temperature so as to cause the solder to reflow is performed without the semiconductor component being held by an holding mechanism.

4. The method of claim 1, wherein the solder includes an eutectic solder made from an alloy having gold and tin.

5. The method of claim 4, wherein the alloy has about 80% gold and about 20% tin.

6. The method of claim 1, wherein the heated gas is supplied to the compartment so as to maintain the compartment at a predetermined pressure level.

7. The method of claim 6, wherein the compartment includes a baffle mounted therein so as to facilitate the circulation of the heated gas substantially evenly in the compartment.

8. The method of claim 7, wherein the pressure level ranges from an atmospheric pressure to about 30 psi.

9. The method of claim 8, wherein the heated gas applies a substantially even pressure against the semiconductor component.

10. The method of claim 9, wherein the compartment is maintained at the pressure level by supplying the heated gas at a rate ranging from about 1 cfm to about 3 cfm.

11. The method of claim 7, wherein the heated gas is heated to a third temperature ranging from about 200° C. to about 400° C.

12. The method of claim 11, wherein the third temperature is about 350° C.

13. The method of claim 11, wherein the substrate is supported on the platform throughout the performance of said step of heating the platform so as to cause the solder to reflow, the compartment being enclosed at least partially by said platform.

14. The method of claim 1, wherein first temperature ranges from about 200° C. to about 400° C.

15. The method of claim 14, wherein said first temperature is about 330° C.

16. The method of claim 1, wherein the heated gas is selected from a group consisting of inert gases and forming gases.

17. The method of claim 16, wherein the heated gas is nitrogen.

18. The method of said claim 2, wherein said placing step includes the step of heating the semiconductor component to a third temperature prior to the performance of said pressing step, the third temperature being lower than the reflow temperature of the solder.

19. The method of claim 18, wherein the second temperature ranges from about 100° C. to about 300° C.; and wherein the third temperature is not greater than about 200° C.

20. The method of claim 19, wherein the second temperature is about 200° C.; and wherein the third temperature is about 100° C.

21. The method of claim 1, wherein said cooling step is performed by supplying an unheated gas to the compartment.

* * * * *